(12) United States Patent
Watanabe

(10) Patent No.: US 9,653,685 B2
(45) Date of Patent: May 16, 2017

(54) INK FOR FUNCTIONAL LAYER FORMATION, METHOD FOR MANUFACTURING LIGHT EMITTING ELEMENT, LIGHT EMITTING DEVICE, AND ELECTRONIC APPARATUS

(71) Applicant: SEIKO EPSON CORPORATION, Tokyo (JP)

(72) Inventor: Shotaro Watanabe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 13 days.

(21) Appl. No.: 14/663,055

(22) Filed: Mar. 19, 2015

(65) Prior Publication Data
US 2015/0270485 A1   Sep. 24, 2015

(30) Foreign Application Priority Data
Mar. 24, 2014   (JP) ................. 2014-059704

(51) Int. Cl.
| | | |
|---|---|---|
| H01L 51/00 | (2006.01) | |
| C09D 11/30 | (2014.01) | |
| C09D 11/52 | (2014.01) | |
| C09D 11/36 | (2014.01) | |
| H01L 51/50 | (2006.01) | |

(Continued)

(52) U.S. Cl.
CPC .......... *H01L 51/0007* (2013.01); *C09D 11/30* (2013.01); *C09D 11/36* (2013.01); *C09D 11/52* (2013.01); *H01L 27/3211* (2013.01); *H01L 51/0005* (2013.01); *H01L 51/5012* (2013.01); *H01L 51/5016* (2013.01);

(Continued)

(58) Field of Classification Search
CPC ............ H01L 51/0007; H01L 51/5016; H01L 51/5056; H01L 27/3211; H01L 51/0005; H01L 51/5271; H01L 51/5012; H01L 51/5088; C09D 11/36; C09D 11/52; C09D 11/30

See application file for complete search history.

(56) References Cited

U.S. PATENT DOCUMENTS

| | | |
|---|---|---|
| 7,704,785 B2 | 4/2010 | Steiger et al. |
| 2004/0109051 A1 | 6/2004 | Bright et al. |

(Continued)

FOREIGN PATENT DOCUMENTS

| | | |
|---|---|---|
| EP | 2843015 A1 | 3/2015 |
| JP | 2004179144 A | 6/2004 |

(Continued)

OTHER PUBLICATIONS

Eastman Chemical Company, Technical Data Sheet for 1,3 diisopropylbenzene; dated May 15, 2003, one page.*

(Continued)

*Primary Examiner* — Michael Jung
*Assistant Examiner* — Charles R Peters
(74) *Attorney, Agent, or Firm* — Oliff PLC

(57) ABSTRACT

The ink for functional layer formation includes a first component that is a solute; and a second component with a boiling point of 280° C. or higher and 350° C. or lower, is a good solvent, and is at least one type selected from a group consisting of an aromatic hydrocarbon including at least two aromatic rings, aromatic glycol ether, aliphatic glycol ether, aliphatic acetate, and aliphatic ester.

5 Claims, 10 Drawing Sheets

(51) Int. Cl.
*H01L 51/52* (2006.01)
*H01L 27/32* (2006.01)

(52) U.S. Cl.
CPC ...... *H01L 51/5056* (2013.01); *H01L 51/5088* (2013.01); *H01L 51/5271* (2013.01)

(56) References Cited

U.S. PATENT DOCUMENTS

| | | |
|---|---|---|
| 2006/0045959 A1 | 3/2006 | Yasukawa et al. |
| 2006/0283385 A1 | 12/2006 | Iwata et al. |
| 2008/0038488 A1 | 2/2008 | Yamamoto |
| 2008/0265214 A1 | 10/2008 | Steiger et al. |
| 2009/0025605 A1 | 1/2009 | Ishimaru et al. |
| 2013/0069020 A1* | 3/2013 | May .............. C09K 11/06 252/519.21 |
| 2013/0256636 A1 | 10/2013 | Watanabe |
| 2014/0138655 A1 | 5/2014 | Sonoyama et al. |
| 2014/0363911 A1* | 12/2014 | Takashige .......... H01L 51/0005 438/34 |
| 2015/0044802 A1* | 2/2015 | Tregub ............. H01L 51/5012 438/46 |

FOREIGN PATENT DOCUMENTS

| | | |
|---|---|---|
| JP | 2004300181 A | 10/2004 |
| JP | 2006346647 A | 12/2006 |
| JP | 2008072017 A | 3/2008 |
| JP | 2009052018 A | 3/2009 |
| JP | 4616596 B2 | 1/2011 |
| JP | 4707658 B2 | 6/2011 |
| JP | 2012067203 A | 4/2012 |
| JP | 5019454 B2 | 9/2012 |

OTHER PUBLICATIONS

Liquid Scintillation Spectrometery 1992, edited by Noakes, Schonhofer and Polach, Radiocarbon 1993, pp. 185-191.*
Jun. 30, 2015 Search Report in European Application No. 15159610.3.

* cited by examiner

FIG. 5A

| FUNCTIONAL LAYER | FIRST COMPONENT (SOLUTE) | SECOND COMPONENT (MAIN SOLVENT) | bp (°C) | VISCOSITY [cp] | SOLUBILITY | FILM FLATNESS | |
|---|---|---|---|---|---|---|---|
| HIL, HTL | ⟨HIGH MOLECULAR WEIGHT⟩ PVK PF PPV PMPS Poly[N, N'-bis(4-butylphenyl)-N, N'-bis(phenyl)-benzidine] TFB | ETHYLENE GLYCOL MONOPHENYL ETHER | 283 | 25.2 | A | B | EXAMPLE 1 |
| | | ISOPROPYL BIPHENYL | 300 | 10.5 | A | B | EXAMPLE 2 |
| | | TETRAETHYLENE GLYCOL MONOBUTYL ETHER | 304 | 14 | B | B | EXAMPLE 3 |
| | | TRIBUTYRIN | 305 | 17.5 | B | B | EXAMPLE 4 |
| | | 1,1-BIS(3, 4-DIMETHYLPHENYL)ETHANE | 333 | 34.1 | A | A | EXAMPLE 5 |
| | | TRIETHYLENE GLYCOL BIS (2-ETHYLHEXANOATE) | 344 | 15.8 | B | B | EXAMPLE 6 |
| | ⟨LOW MOLECULAR WEIGHT⟩ CuPc, TAPC, TPD, α-NPD, m-MT DATA 2-TNATA, TCTA, TDAPB SPIRO-TAD, DPPD, DTP HTM1, HTM2, TPT1, TPTE | DIETHYLENE GLYCOL BUTYL METHYLETHER | 210 | 2 | B | D | COMPARATIVE EXAMPLE 1 |
| | | DIETHYLENE GLYCOL DIBUTYL ETHER | 256 | 2.4 | B | D | COMPARATIVE EXAMPLE 2 |
| | | 1, 4-DIISOPROPYL BENZENE | 205 | 1.9 | B | D | COMPARATIVE EXAMPLE 3 |
| | | CYCLOHEXYLBENZENE | 236 | 2.6 | A | D | COMPARATIVE EXAMPLE 4 |
| | | NONYL BENZENE | 282 | 6 | A | D | COMPARATIVE EXAMPLE 5 |
| | | DECYLBENZENE | 298 | 8 | B | D | COMPARATIVE EXAMPLE 6 |
| | | 3-PHENOXY TOLUENE | 272 | 5.8 | A | D | COMPARATIVE EXAMPLE 7 |

FIG. 5B

| FUNCTIONAL LAYER | FIRST COMPONENT (SOLUTE) | SECOND COMPONENT (MAIN SOLVENT) | bp (°C) | VISCOSITY [cp] | SOLUBILITY | FILM FLATNESS | |
|---|---|---|---|---|---|---|---|
| EML | <HIGH MOLECULAR WEIGHT> Poly[(9, 9-dihexyl-2, 7-bis(1-cyanovinyl-enefluorenylene)-alt-co-{2, 5-bis(N, N'-diphenylamino)-1, 4-phenylene}] Poly(9, 9-dihexylfluorenyl-2, 7-diyl) Poly[(9, 9-dioctylfluorenyl-2, 7-diyl)-co-(N, N'-diphenyl)-N, N'-di(p-butylphenyl) 1, 4-diamino-benzene] <LOW MOLECULAR WEIGHT> <HOST> CBP, BAlq, mCP, CDBP, DCBP06, SimCP, UGH3, TDAPB <RED DOPANT> Bt2Ir(acac), Btp2Ir(acac) PtOEP <GREEN DOPANT> Ir(ppy)3, Ppy2Ir(acac) <BLUE DOPANT> FIrpic, Ir(pmb)3, FIrN4, Firtaz | ETHYLENE GLYCOL MONOPHENYL ETHER | 283 | 25.2 | A | B | EXAMPLE 7 |
| | | ISOPROPYL BIPHENYL | 300 | 10.5 | A | B | EXAMPLE 8 |
| | | TETRAETHYLENE GLYCOL MONOBUTYL ETHER | 304 | 14 | B | B | EXAMPLE 9 |
| | | TRIBUTYRIN | 305 | 17.5 | B | B | EXAMPLE 10 |
| | | 1,1-BIS (3, 4-DIMETHYLPHENYLETHANE) | 333 | 34.1 | A | A | EXAMPLE 11 |
| | | TRIETHYLENE GLYCOL BIS (2-ETHYLHEXANOATE) | 344 | 15.8 | B | B | EXAMPLE 12 |
| | | DIETHYLENE GLYCOL BUTYL METHYLETHER | 210 | 2 | B | D | COMPARATIVE EXAMPLE 8 |
| | | DIETHYLENE GLYCOL DIBUTYL ETHER | 256 | 2.4 | B | D | COMPARATIVE EXAMPLE 9 |
| | | 1, 4-DIISOPROPYL BENZENE | 205 | 1.9 | B | D | COMPARATIVE EXAMPLE 10 |
| | | CYCLOHEXYLBENZENE | 236 | 2.6 | A | D | COMPARATIVE EXAMPLE 11 |
| | | NONYL BENZENE | 282 | 6 | A | D | COMPARATIVE EXAMPLE 12 |
| | | DECYLBENZENE | 298 | 8 | B | D | COMPARATIVE EXAMPLE 13 |
| | | 3-PHENOXY TOLUENE | 272 | 5.8 | A | D | COMPARATIVE EXAMPLE 14 |

FIG. 6A

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | 1,4-DIISOPROPYL BENZENE (bp. 205) | 78 | B | B | B | B | B | B | B | B | B | EXAMPLE 13 |
| | ISOPROPYL BIPHENYL (bp. 300) | | 95 | B | B | B | B | B | B | B | B | B | EXAMPLE 14 |
| | TETRAETHYLENE GLYCOL MONOBUTYL ETHER (bp. 304) | | 99 | B | B | B | B | B | B | B | B | B | EXAMPLE 15 |
| | TRIBUTYRIN (bp. 305) | | 100 | A | A | A | A | A | A | A | A | B | EXAMPLE 16 |
| | 1,1-BIS(3,4-DIMETHYL PHENYL ETHANE) (bp. 333) | | 128 | B | B | B | B | B | B | A | A | B | EXAMPLE 17 |
| | TRIETHYLENE GLYCOL BIS (2-ETHYL HEXANOATE) (bp. 344) | | 139 | B | B | B | B | B | B | B | B | B | EXAMPLE 18 |

FIG. 6B

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | DIETHYLENE GLYCOL BUTYLMETHYL ETHER (bp. 210) | 73 | B | B | B | B | B | B | B | B | B | EXAMPLE 19 |
| | ISOPROPYL BIPHENYL (bp. 300) | | 90 | B | B | B | B | B | B | B | B | B | EXAMPLE 20 |
| | TETRAETHYLENE GLYCOL MONOBUTYL ETHER (bp. 304) | | 94 | B | B | B | B | B | B | B | B | B | EXAMPLE 21 |
| | TRIBUTYRIN (bp. 305) | | 95 | A | A | A | A | A | A | A | A | B | EXAMPLE 22 |
| | 1,1-BIS(3,4-DIMETHYL PHENYL ETHANE) (bp. 333) | | 123 | B | B | B | B | B | B | A | A | B | EXAMPLE 23 |
| | TRIETHYLENE GLYCOL BIS (2-ETHYL HEXANOATE) (bp. 344) | | 134 | B | B | B | B | B | B | B | B | B | EXAMPLE 24 |

FIG. 6C

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | CYCLOHEXYL BENZENE (bp. 236) | 47 | D | D | C | C | C | C | B | B | B | COMPARATIVE EXAMPLE 15 |
| | ISOPROPYL BIPHENYL (bp. 300) | | 64 | B | B | B | B | B | B | B | B | B | EXAMPLE 25 |
| | TETRAETHYLENE GLYCOL MONOBUTYL ETHER (bp. 304) | | 68 | B | B | B | B | B | B | B | B | B | EXAMPLE 26 |
| | TRIBUTYRIN (bp. 305) | | 69 | A | A | A | A | A | A | A | B | B | EXAMPLE 27 |
| | 1,1-BIS (3,4-DIMETHYL PHENYL ETHANE) (bp. 333) | | 97 | B | B | B | B | B | B | B | A | A | EXAMPLE 28 |
| | TRIETHYLENE GLYCOL BIS (2-ETHYL HEXANOATE) (bp. 344) | | 108 | B | B | B | B | B | B | B | B | B | EXAMPLE 29 |

FIG. 6D

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | DIETHYLENE GLYCOL BUTYL ETHYL (bp. 256) | 27 | D | D | D | D | D | C | C | B | B | COMPARATIVE EXAMPLE 16 |
| | ISOPROPYL BIPHENYL (bp. 300) | | 44 | D | C | C | C | C | C | B | B | B | COMPARATIVE EXAMPLE 17 |
| | TETRAETHYLENE GLYCOL MONOBUTYL ETHER (bp. 304) | | 48 | D | C | C | C | C | C | B | B | B | COMPARATIVE EXAMPLE 18 |
| | TRIBUTYRIN (bp. 305) | | 49 | D | C | C | C | A | A | B | B | B | COMPARATIVE EXAMPLE 19 |
| | 1,1-BIS (3,4-DIMETHYL PHENYL ETHANE) (bp. 333) | | 77 | A | A | A | A | A | A | A | A | A | EXAMPLE 30 |
| | TRIETHYLENE GLYCOL BIS (2-ETHYL HEXANOATE) (bp. 344) | | 88 | B | B | B | B | B | B | B | B | B | EXAMPLE 31 |

FIG. 7E

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | 3-PHENOXY TOLUENE (bp. 272) | 11 | D | D | D | D | D | D | D | D | C | COMPARATIVE EXAMPLE 20 |
| | ISOPROPYL BIPHENYL (bp. 300) | | 28 | D | D | D | C | C | C | B | B | B | COMPARATIVE EXAMPLE 21 |
| | TETRAETHYLENE GLYCOL MONOBUTYL ETHER (bp. 304) | | 32 | D | D | C | C | C | C | B | B | B | COMPARATIVE EXAMPLE 22 |
| | TRIBUTYRIN (bp. 305) | | 33 | D | D | D | C | C | C | B | B | B | COMPARATIVE EXAMPLE 23 |
| | 1,1-BIS (3, 4-DIMETHYL PHENYL ETHANE) (bp. 333) | | 61 | A | A | A | A | A | A | A | A | A | EXAMPLE 32 |
| | TRIETHYLENE GLYCOL BIS (2-ETHYL HEXANOATE) (bp. 344) | | 72 | B | B | B | B | B | B | B | B | B | EXAMPLE 33 |

FIG. 7F

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | NONYL BENZENE (bp. 282) | 1 | D | D | D | D | D | D | D | D | C | COMPARATIVE EXAMPLE 24 |
| | ISOPROPYL BIPHENYL (bp. 300) | | 18 | D | D | D | D | D | D | C | C | B | COMPARATIVE EXAMPLE 25 |
| | TETRAETHYLENE GLYCOL MONOBUTYL ETHER (bp. 304) | | 22 | D | D | D | C | C | C | B | B | B | COMPARATIVE EXAMPLE 26 |
| | TRIBUTYRIN (bp. 305) | | 23 | D | D | D | C | C | C | B | B | B | COMPARATIVE EXAMPLE 27 |
| | 1,1-BIS (3, 4-DIMETHYL PHENYL ETHANE) (bp. 333) | | 51 | A | A | A | A | A | A | A | A | A | EXAMPLE 34 |
| | TRIETHYLENE GLYCOL BIS (2-ETHYL HEXANOATE) (bp. 344) | | 62 | B | B | B | B | B | B | B | B | B | EXAMPLE 35 |

FIG. 7G

| FUNCTIONAL LAYER | MIXED SOLVENT (MIXING RATIO: SECOND COMPONENT:THIRD COMPONENT = 10:90, 20:80, 30:70, 40:60, 50:50, 60:40, 70:30, 80:20, 90:10) | | | FILM FLATNESS | | | | | | | | | |
|---|---|---|---|---|---|---|---|---|---|---|---|---|---|
| | SECOND COMPONENT | THIRD COMPONENT | BOILING POINT | 10:90 | 20:80 | 30:70 | 40:60 | 50:50 | 60:40 | 70:30 | 80:20 | 90:10 | |
| HIL HTL EML | ETHYLENE GLYCOL MONOPHENYL ETHER (bp. 283) | DECYL BENZENE (bp. 298) | −15 | D | D | D | D | D | D | D | D | C | COMPARATIVE EXAMPLE 28 |
| | ISOPROPYL BIPHENYL (bp. 300) | | 2 | D | D | D | D | D | D | D | D | C | COMPARATIVE EXAMPLE 29 |
| | TETRAETHYLENE GLYCOL MONOBUTYL ETHER (bp. 304) | | 6 | D | D | D | D | D | D | D | C | B | COMPARATIVE EXAMPLE 30 |
| | TRIBUTYRIN (bp. 305) | | 7 | D | D | D | D | D | D | D | C | B | COMPARATIVE EXAMPLE 31 |
| | 1,1-BIS (3, 4-DIMETHYL PHENYL ETHANE) (bp. 333) | | 35 | D | C | C | C | B | B | A | A | A | COMPARATIVE EXAMPLE 32 |
| | TRIETHYLENE GLYCOL BIS (2-ETHYL HEXANOATE) (bp. 344) | | 46 | D | C | C | C | C | C | B | B | B | COMPARATIVE EXAMPLE 33 |

INK FOR FUNCTIONAL LAYER FORMATION, METHOD FOR MANUFACTURING LIGHT EMITTING ELEMENT, LIGHT EMITTING DEVICE, AND ELECTRONIC APPARATUS

BACKGROUND

1. Technical Field

The present invention relates to an ink for functional layer formation, a method for manufacturing a light emitting element using the ink for functional layer formation, a light emitting device, and an electronic apparatus.

2. Related Art

In recent years, a method using a liquid-phase process has been proposed as a method for forming a functional layer, such as a colored layer for a color filter (filter layer), a light emitting layer for an organic electroluminescence element, and a semiconductor layer for an organic thin film transistor. Among the liquid-phase processes, ink jet methods (also referred to as liquid droplet discharge methods) has garnered attention as methods able to precisely coat a predetermined position with a predetermined amount of ink as a liquid droplet from an ink jet head.

Meanwhile, in the ink (solution) used in the ink jet method, clogging of the nozzles occurs when the solid content precipitates on the nozzles of the ink jet heat due to drying, and discharge defects in which the landing position of the liquid droplets varies or the discharge amount of the liquid droplets discharged from the nozzles varies occur. Accordingly, there is demand for an ink (solution) in which discharge defects do not easily occur. Since the functional layer (functional film) is formed by coating and drying the ink (solution), there is demand for an ink that is able to coat a predetermined region on a coating target, such as a substrate, without irregularities.

Japanese Patent No. 4616596 discloses an ink composition for amorphous film formation that includes a first solvent with an organic material solubility of 0.5 wt % or greater, and a second solvent formed of an alcohol compound with boiling point of 120° C. or higher at an organic material solubility of 0.1 wt % or less, and the boiling point of the first solvent is higher than the boiling point of the second solvent. According to Japanese Patent No. 4616596, it is disclosed that ink composition for amorphous film formation is suitable to an ink jet method.

For example, Japanese Patent No. 4707658 discloses a coating solution that includes a mixed solvent and functional material, in which the mixed solvent has two or more aromatic rings and includes a first solvent configured by a compound having a symmetrical structure and another solvent. By using the coating solution, clogging of the nozzles in the ink jet method does not easily occur, and it is possible for stable discharge to be realized.

For example, Japanese Patent No. 5019454 discloses an organic semiconductor solution that includes at least one type of organic solvent A that is a good solvent for an organic semiconductor and at least one type of organic solvent B that is a poor solvent for of an organic semiconductor, in which the boiling point of the organic solvent A is higher than the boiling point of the organic solvent B. According to the solution, the organic semiconductor material does not easily aggregate and precipitate during drying, homogeneous film formation is possible, and it is possible for an organic semiconductor having stable electrical characteristics to be formed.

However, in the ink jet method, when ink is filled in a film formation region surrounded by a partition wall, and dried and solidified in a state in which ink seeps up the side wall of the partition wall, a phenomenon arises in which the film thickness of the functional layer after solidifying becomes thicker at the partition wall side compared to the center portion. According to the movement state of solute in the ink during the drying process, the film thickness in the center portion becomes thick compared to the other parts. That is, a problem arises in which the film thickness in the film formation region fluctuates and it is difficult to obtain a functional layer with a flat cross-sectional shape.

For example, in cases in which a light emitting layer is included in the functional layer, when the film thickness fluctuates, brightness irregularities, and color irregularities in light emission color occur.

SUMMARY

The invention can be realized in the following forms or application examples.

APPLICATION EXAMPLE

According to this application example, there is provided an ink for functional layer formation that includes a first component that is a solute; and a second component with a boiling point of 280° C. or higher and 350° C. or lower, is a good solvent for the first component, and is at least one type selected from the group consisting of an aromatic hydrocarbon including at least two aromatic rings, aromatic glycol ether, aliphatic glycol ether, aliphatic acetate, and aliphatic ester.

In this case, when the ink for functional layer formation is coated onto a film formation region surrounded by a partition wall using the ink jet method (liquid droplet discharge method) and dried, it is difficult for the ink for functional layer formation to seep up the partition wall, and drying of the second component proceeds slowly because the viscosity of the ink for functional layer formation increases so that the fluidity of the ink for functional layer formation lowers, compared to a case in which the organic functional layer with a boiling point of lower than 280° C. is selected as the second component. Accordingly, it is possible to provide an ink for functional layer formation which is able to form a functional layer with a comparatively flat cross-sectional shape in the film formation region after drying.

It is preferable that the ink for functional layer formation according to the application example further include a third component with a boiling point of 200° C. or higher and 300° C. or lower, is a good solvent for the first component, and is at least one type selected from a group consisting of an aromatic hydrocarbon, an aromatic ether, and an aliphatic ether; in which the proportion of the second compound in a mixed solvent including the second component and the third component is 10 wt % or greater.

According to the configuration, by further including the third component, it is possible to adjust the viscosity while suppressing the fluidity of the ink, thereby providing an ink for functional layer formation suitable to an ink jet method (liquid droplet discharge method).

In the ink for functional layer formation according to the application example, it is preferable that the boiling point of the second component be higher than the boiling point of the third component, and the difference between the boiling points of the second component and the third component be 50° C. or higher.

According to the configuration, since the difference between the boiling points of the second and third components is 50° C. or higher, it is possible for the second component that is a good solvent for the first component to remain in the film formation region in the drying process of the ink for functional layer formation, even if the third component is evaporated first, and possible to ensure the leveling properties. That is, it is possible to realize a functional layer with a flatter cross-sectional shape in the film forming region.

In the ink for functional layer formation according to the application example, it is preferable that the viscosity of the second component be 10 cp or higher and 40 cp or lower.

According to the configuration, it is possible to provide an ink for functional layer formation with a viscosity suitable to an ink jet method (liquid droplet discharge method) while suppressing the fluidity of the ink for functional layer formation.

In the ink for functional layer formation according to the application example, it is preferable that the viscosity of the second component be 10 cp or higher and 40 cp or lower, and the viscosity of the third component be lower than 10 cp.

According to the configuration, it is possible to provide an ink for functional layer formation with a viscosity suitable to an ink jet method (liquid droplet discharge method) while suppressing the fluidity of the ink for functional layer formation.

APPLICATION EXAMPLE

According to the application example, there is provided a method for manufacturing a light emitting element in which a functional layer that includes a light emitting layer is pinched between a pair of electrodes, the method including forming a partition wall with a liquid repellent surface, which surrounds a film formation region that includes one of the pair of electrodes on a substrate; coating the ink for functional layer formation according to the application example onto the film formation region; and drying and solidifying the coated ink for functional layer formation, in which the first component of the ink for functional layer formation is an organic semiconductor material.

According to the application example, since it is possible to form a functional layer with a comparatively flat cross-sectional shape in the film formation region by using the ink for functional layer formation according to the application example, it is possible to manufacture a light emitting element with few brightness irregularities or light emission color irregularities.

In the method for manufacturing a light emitting element according to the application example, the first component is a high molecular weight or a low molecular weight organic semiconductor material.

Since the ink for functional layer formation of the aspects of the invention can form a functional layer with a comparatively flat cross-sectional shape after drying, even if the first component that is a solute is a high molecular weight or low molecular weight organic semiconductor material, it is possible to form a functional layer in which the characteristics of the respective materials are reflected.

In the method for manufacturing a light emitting element according to the application example, it is preferable that the coating include decompressing and drying.

According to the method, by decompressing and drying the ink for functional layer formation, since drying of the solvent proceeds without irregularities compared to heating and drying, film thickness irregularities caused by drying irregularities do not easily occur, and it is possible to form a functional layer with a flatter cross-sectional shape.

APPLICATION EXAMPLE

According to the application example, there is provided a light emitting device that includes a light emitting element manufactured using the method for manufacturing a light emitting element according to the application example.

According to the application example, since a light emitting element with few brightness irregularities or light emission color irregularities is included, it is possible to provide a light emitting device having superior light emitting characteristics (display characteristics).

In the light emitting device according to the application example, the light emitting element is a top emission-type.

Brightness irregularities and light emission color irregularities caused by variations in the cross-sectional shape of the functional layer are more easily noticed in the top emission-type than the bottom emission-type. Accordingly, if the invention is applied to the top emission-type light emitting element, it is possible to provide a top emission-type light emitting element having superior light emitting characteristics than the related art.

APPLICATION EXAMPLE

According to the application example, there is provided an electronic apparatus including the light emitting device of the application example.

According to the application example, it is possible to provide an electronic apparatus including a light emitting device having superior light emitting characteristics (display characteristics).

BRIEF DESCRIPTION OF THE DRAWINGS

The invention will be described with reference to the accompanying drawings, wherein like numbers reference like elements.

FIG. 5A is a table showing the constitutions and evaluation results of inks for functional layer formation in Examples 1 to 6 and Comparative Examples 1 to 7. FIG. 5B is a table showing the constitutions and evaluation results of inks for functional layer formation in Examples 7 to 12 and Comparative Examples 8 to 14.

FIGS. 6A to 6D are tables showing the constitutions and evaluation results of inks for functional layer formation of Examples 13 to 31 and Comparative Examples 15 to 19.

FIGS. 7E to 7G are tables showing the constitutions and evaluation results of inks for functional layer formation of Examples 32 to 35 and Comparative Examples 20 to 33.

DESCRIPTION OF EXEMPLARY EMBODIMENTS

Hereinafter, specific embodiments of the invention will be described with reference to the drawings. The drawings to be used are displayed after enlarging or reducing, as appropriate, in order that the portions to be described are recognizable.

First Embodiment

Light Emitting Device

Figure 1:
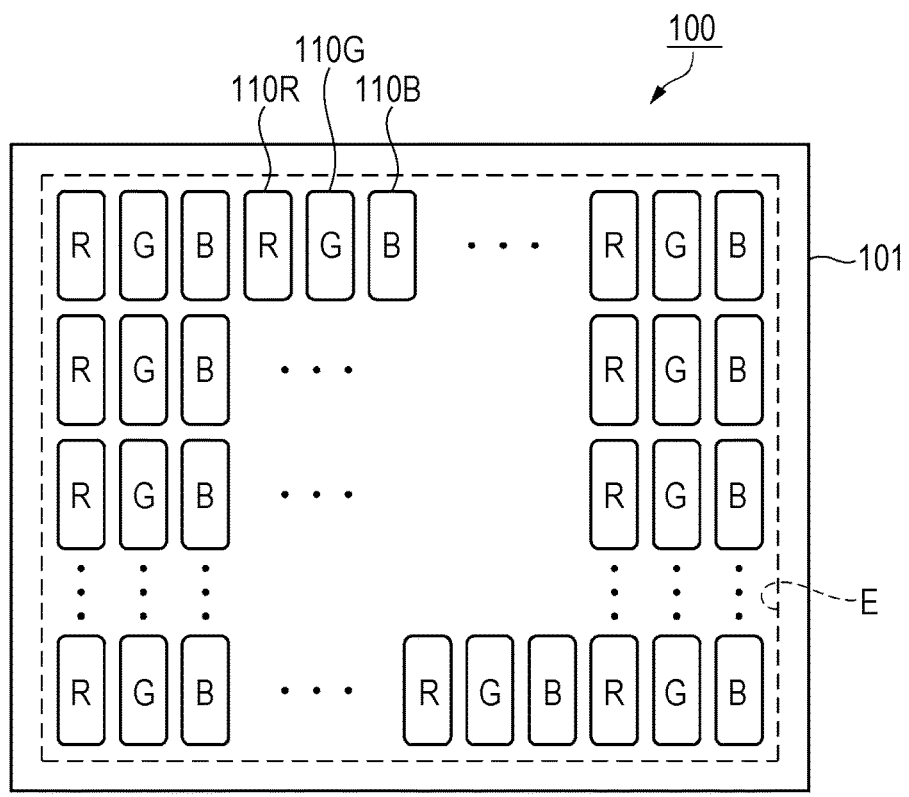
FIG. 1 is a schematic plan view showing a configuration of a light emitting device.
Figure 2:
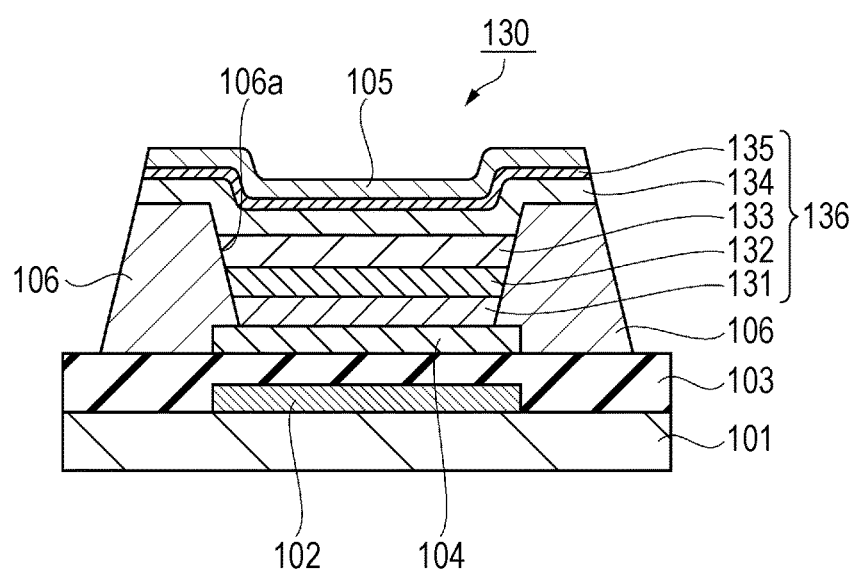
FIG. 2 is a schematic cross-sectional view showing a configuration of an organic electroluminescence element.

First, the light emitting device of the embodiment will be described with reference to FIGS. 1 and 2. FIG. 1 is a schematic plan view showing the configuration of light emitting device, and FIG. 2 is a schematic cross-sectional view showing the configuration of an organic electroluminescence element.

As shown in FIG. 1, the light emitting device 100 of the embodiment includes an element substrate 101 as a substrate on which sub-pixels 110R, 110G, and 110B from which red (R), green (G), and blue (B) light emission (light emission color) is obtained are arranged. Each of sub-pixels 110R, 110G, and 110B has a substantially rectangular shape, and is arranged in matrix form in the display region E of the element substrate 101. Below, the sub-pixels 110R, 110G, and 110B are also collectively referred to as a sub-pixel 110. Sub-pixels 110 having the same light emission color are arranged in the direction orthogonal to the top of the drawing (column direction or longitudinal direction of the sub-pixel 110), and sub-pixels 110 having a different light emission color are arranged in the horizontal direction to the top of the drawing (row direction or short direction of the sub-pixel 110) in the order R, G, and B. That is, the sub-pixels 110R, 110G, and 110B having a different light emission color are arranged in a so-called stripe format. The planar shape and arrangement of the sub-pixels 110R, 110G, and 110B are not limited thereto. The substantially rectangular shape includes a quadrilateral shape with the corners rounded and a quadrilateral shape with two opposing sides having an arc shape, in addition to a square or rectangular shape.

An organic electroluminescence (EL) element as a light emitting element able to obtain red (R) light emission is provided in the sub-pixel 110R. Similarly, an organic EL element able to obtain green (G) light emission is provided in the sub-pixel 110G, and an organic EL element able to obtain blue (B) light emission is provided in the sub-pixel 110B.

The three sub-pixels 110R, 110G, and 110B from which different light emission colors are obtained in such a light emitting device 100 are taken as one display pixel unit, and the respective sub-pixels 110R, 110G, and 110B are electrically controlled. In so doing, full color display is possible.

An organic EL element 130 as a light emitting element shown in FIG. 2 is provided in each of sub-pixels 110R, 110G, and 110B.

The organic EL element 130 includes a reflection layer 102, an insulating film 103, a pixel electrode 104, a counter electrode 105, and a functional layer 136 that includes a light emitting layer 133 formed of an organic thin film and is provided between the pixel electrode 104 and the counter electrode 105, on the element substrate 101.

The pixel electrode 104 functions as an anode, is provided for each of sub-pixels 110R, 110G, and 110B, and is formed using a transparent conductive film, such as indium tin oxide (ITO).

The reflection layer 102 provided on the lower layer of the pixel electrode 104 reflects light emitted from the functional layer 136 that passes through the pixel electrode 104 having optical transparency back to the pixel electrode 104 side.

The reflection layer 102 is formed using a metal having optical reflectivity, such as aluminum (Al) or silver (Ag), or an alloy thereof. Accordingly, the insulating film 103 that covers the reflection layer 102 is provided in order to avoid electrical short circuiting between the reflection layer 102 and the pixel electrode 104. The insulating film 103 is formed using silicon oxide, silicon nitride, or silicon oxynitride.

The functional layer 136 includes a hole injection layer 131, a hole transporting layer 132, a light emitting layer 133, an electron transporting layer 134, and an electron injection layer 135 stacked in this order from the pixel electrode 104 side. In particular, although the constituent material of the light emitting layer 133 is selected according to the light emission color, herein, these are collectively referred to as a light emitting layer 133, regardless of the light emission color. The configuration of the functional layer 136 is not limited thereto, and an intermediate layer or the like that controls the movement of the carrier (holes or electrons) may be provided in addition to these layers.

The counter electrode 105 functions as a cathode, is provided as a common electrode shared by the sub-pixels 110R, 110G, and 110B, and is formed using an alloy of aluminum (Al), silver (Ag), magnesium (Mg) or the like.

Holes are injected as a carrier from the pixel electrode 104 side as an anode to the light emitting layer 133, and electrons are injected as a carrier from the counter electrode 105 side as a cathode to the light emitting layer 133. Excitons (state in which holes and electrons are bound to one another by coulomb force) are formed by the holes and the electrons injected in the light emitting layer 133, and when the excitons disappear (when the holes and electrons are rebonded), a portion of the energy is released as fluorescence and phosphorescence.

In the light emitting device 100, if the counter electrode 105 is configured so as to have optical transparency, since the reflection layer 102 is included, it is possible to remove the light emitted from the light emitting layer 133 from the counter electrode 105 side. Such a light emitting method is referred to as a top emission method. If the reflection layer 102 is eliminated and the counter electrode 105 is configured so as to have optical reflectivity, it is possible to provide a bottom emission method in which light emitted from the light emitting layer 133 is removed from the element substrate 101 side. In the embodiment, subsequent description is made with the light emitting device 100 as a top emission-type. The light emitting device 100 of the embodiment is an active driving-type light emitting device including a pixel circuit capable of independently driving each of the organic EL element 130 for each of sub-pixels 110R, 110G, and 110B on the element substrate 101. Since the pixel circuit is able to employ a known configuration, the pixel circuit is not shown in FIG. 2.

The light emitting device 100 in the embodiment includes a partition wall 106 that configures the opening portion 106a on the pixel electrode 104, along with overlapping the outer edge of the pixel electrode 104 in the organic EL element 130 for each of sub-pixels 110R, 110G, and 110B.

In the functional layer 136 of the organic EL element 130 in the embodiment, at least one layer of the hole injection layer 131, the hole transporting layer 132, the light emitting layer 133 that configure the functional layer 136 is formed by a liquid phase process. The liquid phase process is a method for forming the respective layers by coating and drying a solution (ink for functional layer formation) including the components that configure the respective layers and a solvent in the opening portion 106a as a film formation region surrounded by a partition wall 106. In order to form the respective layers at a predetermined film thickness, it is necessary to precisely coat a predetermined amount of the ink for functional layer formation in the opening portion 106a, and, in the embodiment, an ink jet method (liquid droplet discharge method) is employed as the liquid phase process.

In particular, in the top emission method light emitting device 100, it is preferable that the cross-sectional shape of each layer that configures the functional layer 136 be flat. The ink for functional layer formation of the embodiment has a solvent configuration in which the ink for functional layer formation does not easily seep up the side wall of the partition wall 106 when the ink for functional layer formation is coated and dried in the opening portion 106a, so that the cross-sectional shape of each layer becomes flat. The detailed configuration of the ink for functional layer formation will be described later.

Method for Manufacturing Light Emitting Element

Next, the method for manufacturing the organic EL element as the light emitting element of the embodiment will be described in detail with reference to the FIGS. 3A to 3D. FIGS. 3A to 3D are schematic cross-sectional views showing a method for manufacturing an organic EL element. As described above, since the pixel circuit that drives and controls the organic EL element 130 or the method for forming a reflection layer 102 or the pixel electrode 104 is able to employ a known method, here, description subsequent to a step for forming a partition wall will be made.

The method of forming an organic EL element 130 of the embodiment includes a step for forming a partition wall (step S1), a step for surface treatment (step S2), a step for forming a functional layer (step S3), and a step for forming a counter electrode (step S4).

Figure 3A:
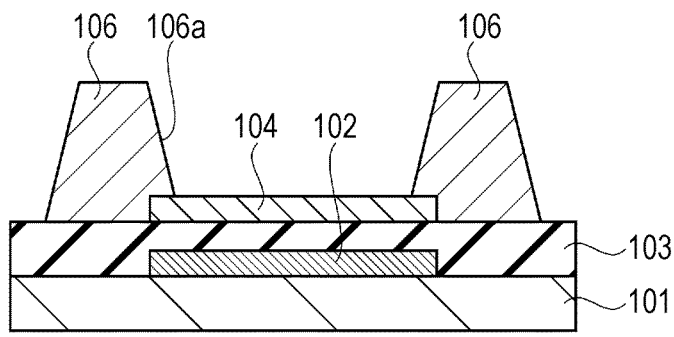
FIGS. 3A to 3D are schematic cross-sectional views showing a method for manufacturing an organic EL element.

In the step for forming a partition wall in step S1, as shown in FIG. 3A, a light sensitive resin layer is formed on the element substrate 101 on which the reflection layer 102 and the pixel electrode 104 is formed by coating at a thickness of 1 µm to 2 µm and drying a light sensitive resin material including a liquid repellent material exhibiting liquid repellency with respect to the ink for functional layer formation. Examples of the coating method include a transfer method and a slit coating method. Examples of the liquid repellent material include fluorine compounds and siloxane compounds. Examples of the light sensitive resin material include negative polyfunctional acrylic resins. The completed light sensitive resin layer is exposed and developed using an exposure mask corresponding to the shape of the sub-pixels 110, and the partition wall 106 that configures the opening portion 106a on the pixel electrode 104 is formed and overlaps the outer edge of the pixel electrode 104. Next, the process proceeds to step S2.

In the step for surface treatment in step S2, the element substrate 101 on which the partition wall 106 is formed is subjected to surface treatment. The step for surface treatment is performed with the goal of removing unnecessary materials, such as partition wall residue, on the surface of the pixel electrode 104 so that ink for functional layer formation including a functional layer forming material wets and spreads without irregularities in the opening portion 106a surrounded by the partition wall 106 upon forming the hole injection layer 131, the hole transporting layer 132, and the light emitting layer 133 that configured the functional layer 136 with an ink jet method (liquid droplet discharge method) in the next step. In the embodiment, an excimer UV (ultraviolet rays) treatment is performed as the surface treatment method. The surface treatment method is not limited to an excimer UV treatment, and if the surface of the pixel electrode 104 is able to be purified, for example, a step for cleaning and drying with a solvent may be performed. If the surface of the pixel electrode 104 is in a purified state, the step for surface treatment may be not performed. In the embodiment, although the partition wall 106 is formed using the light sensitive resin material including a liquid repellent material, there is no limitation thereto, and the liquid repellency may be imparted to the surface of the partition wall 106 by performing a plasma treatment using a fluorine treatment gas in step S2, and thereafter a surface treatment is performed, which makes the surface of the pixel electrode 104 lyophilic by performing a plasma treatment with oxygen as the process gas, after the partition wall 106 is formed using a light sensitive material not including a liquid repellent material. Next, the process proceeds to step S3.

Figure 3B:
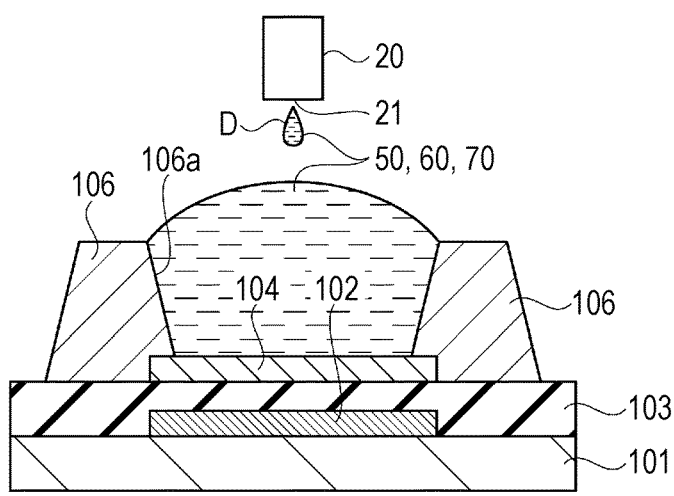

In the step for forming a functional layer in step S3, as shown in FIG. 3B, the ink for hole injection layer formation 50 as an ink for functional layer formation including a hole injection material (first component) is coated in the opening portion 106a. The method for coating the ink for hole injection layer formation 50 uses an ink jet method (liquid droplet discharge method) that discharges the ink for hole injection layer formation 50 from the nozzles 21 of the ink jet head 20 as liquid droplets D. The discharge amount of the liquid droplets D discharged from the ink jet head 20 is controllable in pl units, and the number of liquid droplets D in which the predetermined amount is divided by the discharge amount of the liquid droplets D is discharged to the opening portion 106a. Although the discharged ink for hole injection layer formation 50 builds up in the opening portion 106a due to the interfacial tension with the partition wall 106, there is no overflowing. In other words, the concentration of the hole injection material (first component) in the ink for hole injection layer formation 50 is adjusted in advance such that the extent of the predetermined amount does not overflow from the opening portion 106a. The process proceeds to the step for drying.

Figure 3C:
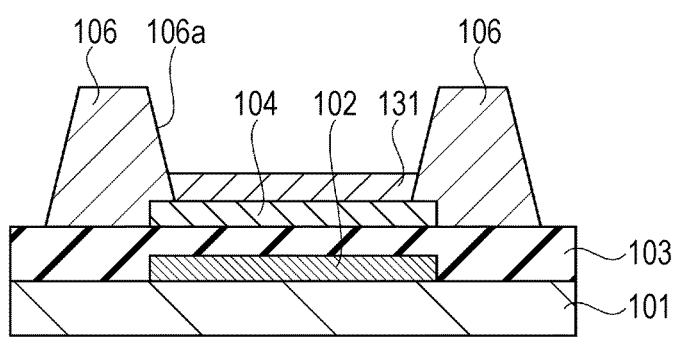

In the step for drying, the element substrate 101 that is coated with the ink for hole injection layer formation 50 is left under reduced pressure, and decompression drying that evaporates the solvent form the ink for hole injection layer formation 50, thereby performing drying is used (step for decompression drying). Thereafter, solidification is performed by performing a heat treatment under atmospheric pressure, and the hole injection layer 131 is formed as shown in FIG. 3C. Although the selection of the hole injection material described later and the relationship with the other layers in the functional layer 136 is not necessarily limited thereto, the hole injection layer 131 is formed at a film thickness of approximately 20 nm to 150 nm.

Next, the hole transporting layer 132 is formed using an ink for hole transporting layer formation 60 as the ink for functional layer formation including the hole transporting material (first component). The method for forming the hole transporting layer 132 is performed using the ink jet method (liquid droplet discharge method) similarly to the hole injection layer 131. That is, a predetermined amount of the ink for hole transporting layer formation 60 is discharged as liquid droplets D from nozzles 21 of the ink jet head 20 to the opening portion 106a. The ink for hole transporting layer formation 60 coated in the opening portion 106a is decompression dried. Thereafter, the hole transporting layer 132 is formed by performing the heat treatment in an inactive gas environment, such as nitrogen. Although the selection of the hole transporting material described later and the relationship with the other layers in the functional layer 136 is not necessarily limited thereto, the hole transporting layer 132 is formed at a film thickness of approximately 20 nm.

Next, the light emitting layer 133 is formed using the ink for light emitting layer formation 70 as the ink for functional layer formation including a light emitting layer forming material (first component). The method for forming the light emitting layer 133 is also performed using the ink jet method (liquid droplet discharge method), similarly to the hole injection layer 131. That is, a predetermined amount of the ink for light emitting layer formation 70 is discharged as liquid droplets D from the nozzles 21 of ink jet head 20 to the opening portion 106a. The ink for light emitting layer formation 70 coated in the opening portion 106a is decompression dried. Thereafter, the light emitting layer 133 is formed by performing the heat treatment in an inactive gas environment, such as nitrogen. Although the selection of the light emitting layer forming material described later and the relationship with the other layers in the functional layer 136 is not necessarily limited thereto, the light emitting layer 133 is formed at a film thickness of approximately 30 nm to 80 nm.

Next, an electron transporting layer 134 is formed by covering the light emitting layer 133. Although not particularly limited, examples of the electron transporting material that configures the electron transporting layer 134 may include BAlq, 1,3,5-tri(5-(4-tert-butylphenyl)-1,3,4-oxadiazole) (OXD-1), BCP (Bathocuproine), 2-(4-biphenyl)-5-(4-tert-butylphenyl)-1,2,4-oxadiazole (PBD), 3-(4-biphenyl)-5-(4-tert-butylphenyl)-1,2,4-triazole (TAZ), 4,4'-bis(1,1-bis-diphenylethenyl)biphenyl (DPVBi), 2,5-bis(1-naphthyl)-1,3,4-oxadiazole (BND), 4,4'-bis(1,1-bis(4-methylphenyl)ethenyl)biphenyl (DTVBi), and 2,5-bis(4-biphenylyl)-1,3,4-oxadiazole (BBD) so as to be able to be formed using the gas phase process such as a vacuum deposition method.

Examples thereof include tris (8-quinolinolato) aluminum (Alq3), oxadiazole derivatives, oxazole derivatives, phenanthroline derivatives, anthra quinodimethane derivative, benzoquinone derivatives, naphthoquinone derivative, anthraquinone derivatives, tetracyanoanthra quinodimethane derivative, fluorene derivatives, diphenyldicyanoethylene derivative, diphenoquinone derivatives, and hydroxyquinoline derivatives. Among these, it is possible to use one type or a combination of two or more types thereof.

Although the selection of the electron transporting material described above and the relationship with the other layers in the functional layer 136 is not necessarily limited thereto, the electron transporting layer 134 is formed at a film thickness of approximately 20 nm to 40 nm. In so doing, it is possible for electrons injected from the counter electrode 105 as a cathode to be suitably transported to the light emitting layer 133.

Next, the electron injection layer 135 is formed by covering the electron transporting layer 134. Although the electron injection material that configures the electron injection layer 135 is not particularly limited, in order to form using the gas phase process such as a vacuum deposition method, possible examples thereof include alkali metal compounds and alkaline earth metal compounds.

Examples of the alkali metal compounds include alkali metal salts such as LiF, $Li_2CO_3$, LiCl, NaF, $Na_2CO_3$, NaCl, CsF, $Cs_2CO_3$, and CsCl. Examples of the alkaline earth metal compounds include alkaline earth metal salts such as $CaF_2$, $CaCO_3$, $SrF_2$, $SrCO_3$, $BaF_2$, $BaCO_3$. It is possible to use one kind among the alkali metal compounds and alkaline earth metal compounds or a combination of two or more kinds thereof.

Although the film thickness of the electron injection layer 135 is not particularly limited, approximately 0.01 nm or more and 10 nm or less is preferable, and approximately 0.1 nm or more and 5 nm or less is more preferable. Thereby, electrons can be efficiently injected from the counter electrode 105 as a cathode to the electron transporting layer 134.

Next, a counter electrode 105 is formed as a cathode by covering the electron injection layer 135. It is preferable to use a material with a low work function as the constituent material of the counter electrode 105, and, for example, it is possible for Li, Mg, Ca, Sr, La, Ce, Er, Eu, Sc, Y, Yb, Ag, Cu, Al, Cs, Rb, and Au, or alloys including the above, or the like, to be used, and it is possible to use one type or a combination (for example, a laminate body with a plurality of layers, or the like) of two or more types thereof in order to form the counter electrode using a gas phase process, such as a vacuum deposition method.

In particular, as in the embodiment, in cases in which the light emitting device 100 is in a top-emission format, it is preferable that the constituent material of the counter electrode 105 be a metal, such as Mg, Al, Ag, and Au, or an alloy, such as MgAg, MgAl, MgAu, and AlAg. It is possible to achieve improvement in the electron injection efficiency and stability of the counter electrode 105 while maintaining the optical transparency of the counter electrode 105 by using such metals or alloys.

Although the film thickness of the counter electrode 105 in the top emission method is not particularly limited, approximately 1 nm or more and 50 nm or less is preferable, and approximately 5 nm or more and 20 nm or less is more preferable.

In cases where the light emitting device 100 is in a bottom emission format, there is no demand for optical transparency in the counter electrode 105. Accordingly, a metal such as Al, Ag, AlAg, and AlNd or alloys thereof are preferably used. It is possible to achieve improvements in the electron injection efficiency and stability of the counter electrode 105 by using such metals or alloys as the constituent material of the counter electrode 105.

Although the film thickness of the counter electrode 105 in the bottom emission format is not particularly limited; approximately 50 nm or more and 1000 nm or less is preferable, and approximately 100 nm or more and 500 nm or less is more preferable.

Figure 3D:
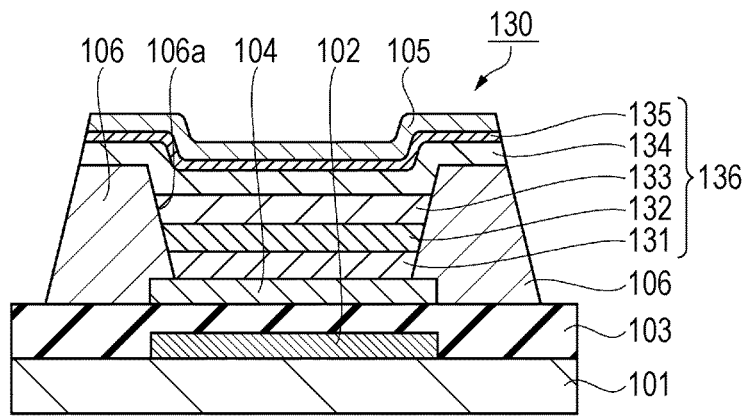

As shown in FIG. 3D, the light emitting function in the functional layer 136 of the organic EL element 130 formed by the above method for manufacturing is impaired when moisture, oxygen, or the like infiltrates from the outside, the light emission brightness is partially lowered, and dark points (dark spots) that do not emit light are generated. There is concern of the light emitting service life being shortened. In order to protect the organic EL element 130 from the infiltration of moisture, oxygen, or the like, it is preferable that a sealing layer (not shown) cover the organic EL element. It is possible to use an inorganic insulating material, such as silicon oxynitride (SiON), with a low permeability to moisture, oxygen, or the like, as the sealing layer. A sealing substrate, such as a transparent glass, may be further sealed to the organic EL element 130 by being applied to the element substrate 101 on which the organic EL element 130 is formed via an adhesive.

Although hole injection layer 131, the hole transporting layer 132, and the light emitting layer 133 in the functional layer 136 are formed by the liquid phase process (ink jet method) in the method for manufacturing the organic EL element 130, one of these layers may be formed by the liquid phase process (ink jet method), and the other layers may be formed using a gas phase process, such as vacuum deposition.

First Component

The hole injection layer 131, the hole transporting layer 132, and the light emitting layer 133 will be described with respect to a constituent material of the first component able to be used in a liquid phrase process or the gas phase process.

Hole Injection Material

Examples of the hole injection material suitable to the formation of the hole injection layer 131 include high molecular weight organic semiconductor materials, such as poly(3,4-ethylene dioxy thiophene/styrenesulphonate) (PEDOT/PSS), PEDOT/PSS/Nafion (registered trademarks), polythiophene and derivatives thereof, polyaniline and derivatives thereof, polypyrrole and derivatives thereof, and N,N,N',N'-tetraphenyl-p-diamino benzene and derivatives thereof. It is possible to use one type or a combination of two or more types thereof.

Examples of the hole injection material include copper phthalocyanine (CuPc), 1,1-bis[4-(di-p-tolyl)aminophenyl] cyclohexane (TAPC), N,N'-diphenyl-N,N'-bis-(3-methylphenyl)-1,1'-biphenyl-4,4'-diamine (TPD), N,N'-diphenyl-N,N'-bis-(1-naphthyl)-1,1'-biphenyl-4,4'-diamine (α-NPD), 4,4',4''-tris(N-3-methylphenylamino)triphenylamine (m-MTDATA), 4,4',4''-tris(N,N-(2-naphthyl)phenylamino) triphenylamine (2-TNATA), 4,4',4''-tri(N-carbazole group) triphenylamine (TCTA), 1,3,5-tris-(N,N-bis-(4-methoxyphenyl)aminophenyl)benzene (TDAPB), tris-(4-carbazole-9-yl-phenyl)-amine (spiro-TAD), DPPD (DTP), tris-p-tolylamine (HTM1), 1,1-bis[(di-4-tolylamino)phenyl] cyclohexane (HTM2), 1,3,5-tris(4-pyridyl)-2,4,6-triazine (TPT1), and triphenylamine tetramers (TPTE). Any of these hole injection materials is a p-type low molecular weight organic semiconductor material.

Hole Transport Material

The above-described hole injection materials may be used as the hole transporting material suitable to the formation of the hole transporting layer 132. Examples of other materials than the above-described hole injection material include TFB; aromatic amine-based compounds having an aryl amine skeleton, such as a triphenyl amine-based polymer represented by poly(9,9-dioctyl-fluorene-co-N-(4-butylphenyl)-diphenylamine) or a butylphenyl amine based polymer represented by poly[N,N'-bis(4-butylphenyl)-N,N'-bis(phenyl)-benzidine], a polyfluorene derivative (PF) having a fluorene skeleton, such as a fluorene-bithiophene copolymer, or both of an aryl amine skeleton and a fluorene skeleton, such as fluorene-aryl amine copolymer, polyvinylcarbazole (PVK), polyvinyl pyrene, polyvinyl anthracene, polythiophene, polyalkylthiophene, polyhexylthiophene, poly(p-phenylene vinylene), polyethylene vinylene, a pyrene formaldehyde resin, and an ethyl carbazole formaldehyde resin or derivatives thereof. These are p-type high molecular weight organic semiconductor materials. Such p-type high molecular weight materials are able to be used as a mixture with other compounds. As an example, examples of the mixture including polythiophene include poly(3,4-ethylene dioxy thiophene/styrenesulphonate) (PEDOT/PSS).

The light emitting layer 133 includes a dopant (guest material) that is a light emitting material and a host material. The host material generates excitons by recombining the holes and electrons, and has a function of transferring the energy of the excitons into the light emitting material (Forster transfer or Dexter transfer). Light emission guided by energy obtained by rebonding holes and electrons is either of fluorescence and phosphorescence due to the light emitting material. Below, examples of the preferable host material and dopant (guest material) will be given.

Host Material

Examples of the host material common to the light emitting layers 133 able to obtain each of red, green, and blue light emission include CBP (4,4'-bis(9-dicarbazolyl)-2, 2'-biphenyl), BAlq (bis-(2-methyl-8-quinolinolate)-4-(phenylphenolate)aluminum), mCP (N,N'-dicarbazolyl-3,5-benzene: CBP derivative), CDBP (4,4'-bis(9-carbazolyl)-2,2'-dimethyl-biphenyl), DCB (N,N'-dicarbazolyl-1,4-dimethene-benzene), P06 (2,7-bis(diphenylphosphine oxide)-9,9-dimethylfluorene), SimCP (3,5-bis(9-carbazolyl) tetraphenylsilane), UGH3 (W-bis(triphenylsilyl)benzene), and TDAPB (1,3,5-tris[4-(diphenylamino)phenyl]benzen). These host materials are low molecular weight organic semiconductor materials.

Red Light Emitting Material (Dopant)

Examples of the dopant (guest material) able to obtain red light emission include iridium complexes such as Bt2Ir (acac) (bis(2-phenylbenxothiozolato-N,C2')iridium(III) (acetylacetonate)) and Btp2Ir(acac) (bis(2-2'-benzothienyl)-pyridinato-N,C3)Iridium(acetylacetonate) and platinum complexes, such as PtOEP(2,3,7,8,12,13,17,18-octaethyl-21H,23H-porphine,platinum(II)), and it is possible to obtain red phosphorescence by addition to the above-described host materials. These guest materials are low molecular weight organic semiconductor materials.

Meanwhile, examples of the red light emitting material (dopant) using the high molecular weight organic semiconductor material include fluorene derivatives in chemical formulae (1) and (2).

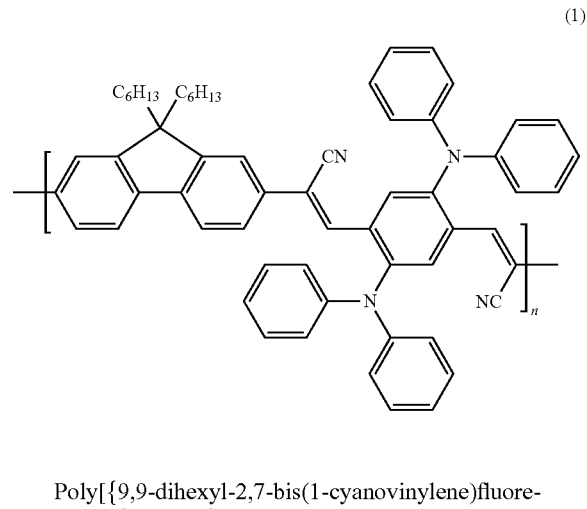

(1)

Poly[{9,9-dihexyl-2,7-bis(1-cyanovinylene)fluorenylene}-alt-co-{2,5-bis(N,N'-diphenylamino)-1,4-phenylene}]

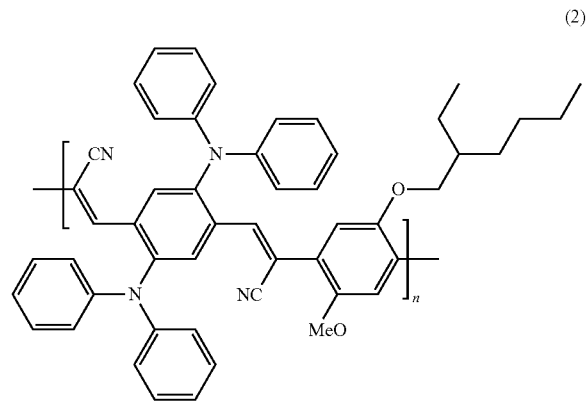

(2)

Poly[{2-methoxy-5-(2-ethylhexyloxy)-1,4-(1-cya-
novinylenephenylene)}-co-{2,5-bis(N,N'-diphe-
nylamino)-1,4-phenylene}]

Green Light Emitting Material (Dopant)

Examples of the dopant (guest material) able to obtain green light emission include iridium complexes, such as Ir(ppy)3(Fac-tris(2-phenypyridine)iridium) and Ppy2Ir (acac) (Bis(2-phenyl-pyridinato-N,C2)iridium(acetylacetone)), and it is possible to obtain green phosphorescence by the addition of the above-described host materials. These guest materials are low molecular weight organic semiconductor materials.

Meanwhile, examples of the green light emitting material (dopant) using the high molecular weight organic semiconductor material include phenylene vinylene derivatives in chemical formulae (3) and (4) and a diphenyl benzene derivative in chemical formula (5).

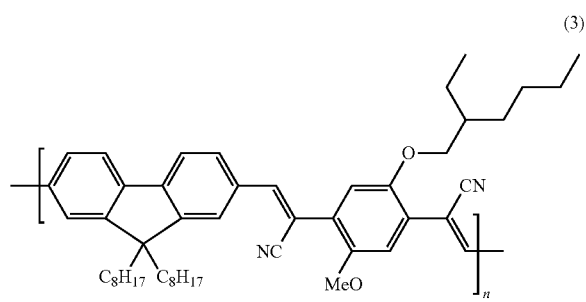

(3)

Poly[(9,9-dioctyl-2,7-bis{2-cyanovinylenefluore-
nylene})-alt-co-(2-methoxy-5-{2-ethylhexyoxy}-1,
4-phenylene)]

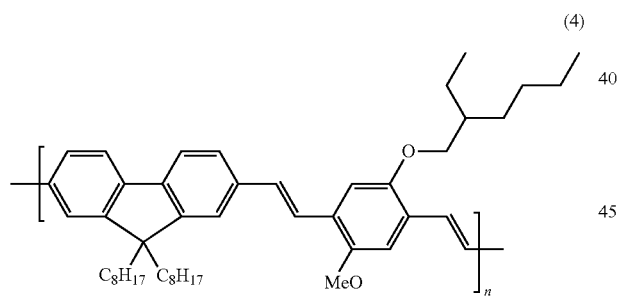

(4)

Poly[(9,9-dioctyl-2,7-divinylenefluorenylene)-alt-co-
{2-methoxy-5-(2-ethylhexyloxy)-1,4-phenylene}]

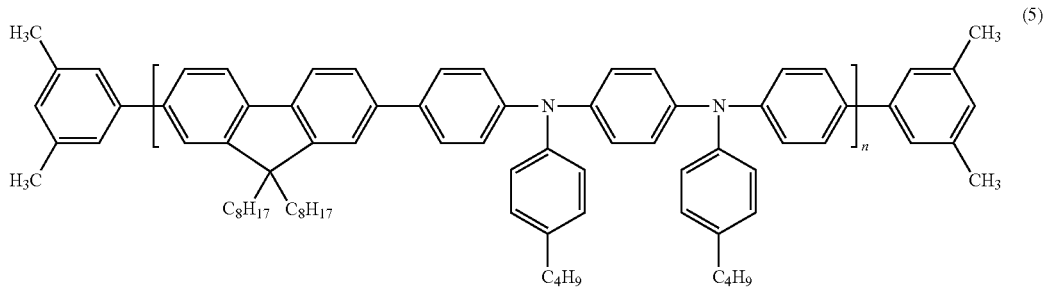

(5)

Poly[(9,9-dioctylfluorenyl-2,7-diyl)-co-(N,N'-diphe-
nyl)-N,N'-di(p-butylphenyl)-1,4-diamino-benzene]

Blue Light Emitting Material (Dopant)

Examples of the dopant (guest material) able to obtain blue light emission include iridium complexes such as FIrpic (Iridium-bis(4,6-difluorophenyl-pyridinato-N,C.2.)-picolinate), Ir(pmb)3(Iridium-tris(1-phenyl-3-methylbenzimidazolin-2-ylidene-C,C(2)')), FIrN4 ((Iridium (III) bis(4,6-difluorophenylpyridinato)(5-(pyridin-2-yl)-tetrazolate)), and Firtaz ((Iridium (III) bis-(4,6-difluorophenylpyridinato)(5-(pyridine-2-yl)-1,2,4-triazolate)). These guest materials are low molecular weight organic semiconductor materials. It is possible to obtain blue phosphorescence by addition of these dopants (guest materials) to the above-described low molecular weight host materials.

It is preferable that styryl derivatives in chemical formulae (6), (7), (8), and (9) be used as the blue light emitting material (guest material) using the low molecular weight organic semiconductor material. It is preferable that the anthracene derivatives that are low molecular weight organic semiconductor materials in chemical formulae (10), (11), and (12) be used as the host material.

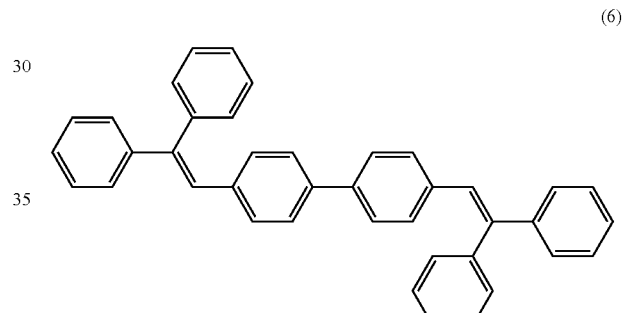

(6)

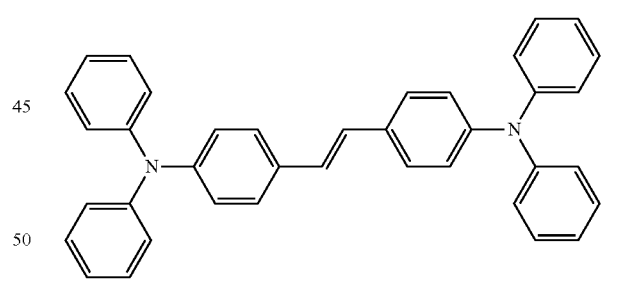

(7)

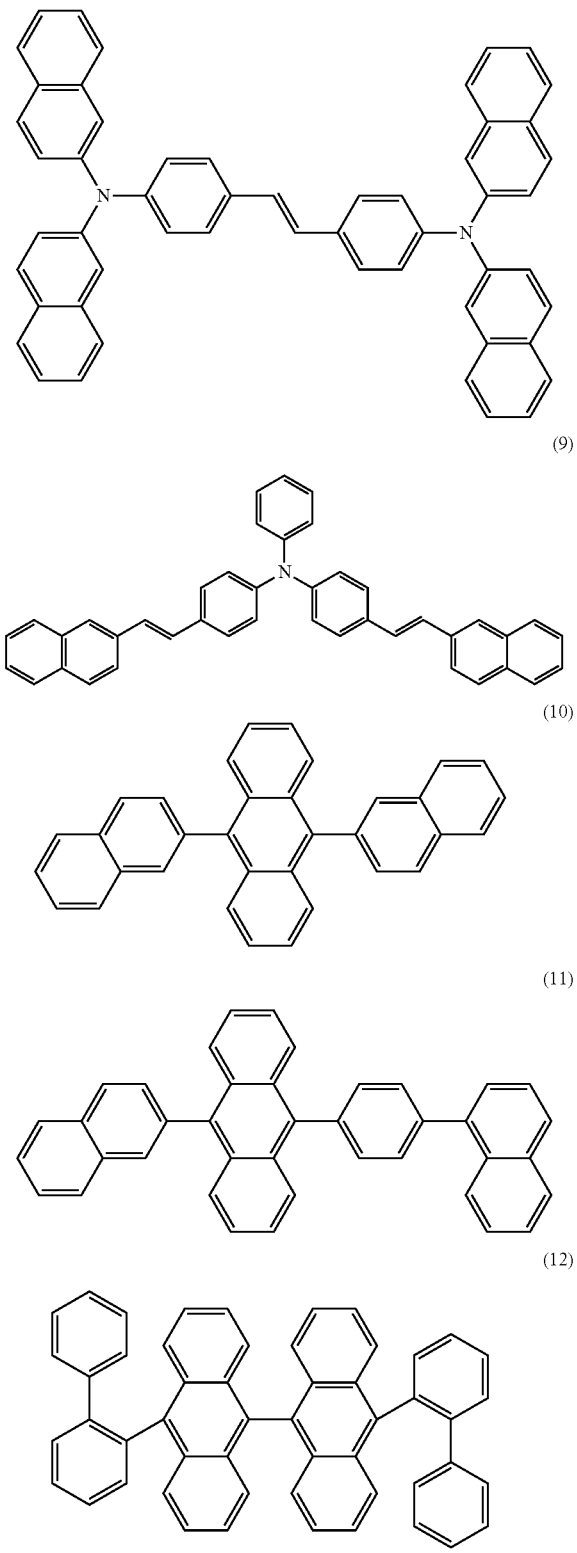
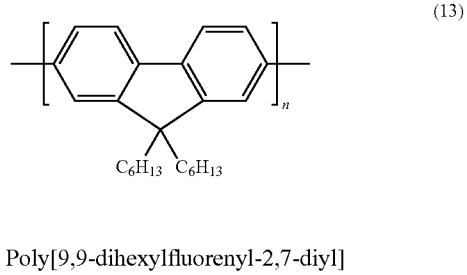

Poly[9,9-dihexylfluorenyl-2,7-diyl]

Examples of the blue light emitting material (dopant) having a high molecular weight include the poly(9,9-dihexylfluorenyl-2,7-diyl) in chemical formula (13) and derivatives thereof.

Examples of the light emitting material (dopant) able to obtain fluorescence include Alq3 (8-hydroxyquinolinate) aluminum, rubrene, perylene, 9,10-diphenyl anthracene, tetraphenylbutadiene, Nile Red, Coumarin 6, and Quinacridone.

Examples of the light emitting material (dopant) able to obtain blue fluorescence include styryl benzene derivatives such as 1,4-bis(2-methylstyryl)benzene, 1,4-(3-methylstyryl)benzene, 1,4-bis-(2-methylstyryl)benzene, 1,4-(3-methylstyryl)benzene, 1,4-bis(2-methylstyryl)benzene, distyryl benzene, 1,4-bis(2-ethylstyryl)benzene, 1,4-bis(3-ethylstyryl)benzene, and 1,4-bis(2-methylstyryl)-2-methylbenzene. Any of these light emitting materials is a low molecular weight organic semiconductor material.

In the embodiment, the term "low molecular weight" indicates having a molecular weight of less than 1000, and the term "high molecular weight" indicates having a structure in which a basic skeleton is repeated and a molecular weight of 1000 or more.

Ink for Functional Layer Formation

Next, the configuration of the ink for functional layer formation of the embodiment will be described. The basic configuration of the ink for functional layer formation suitable when forming the hole injection layer 131, hole transporting layer 132, and light emitting layer 133 in the functional layer 136 of the organic EL element 130 of the embodiment with a liquid phase process (ink jet method) is as follows.

The ink for functional layer formation includes a first component that is a solute; and a second component with a boiling point of 280° C. or higher and 350° C. or lower, is a good solvent for the first component, and is at least one type selected from a group consisting of an aromatic hydrocarbon including at least two aromatic rings, aromatic glycol ether, aliphatic glycol ether, aliphatic acetate, and aliphatic ester.

It is preferable that the ink for functional layer formation further include a third component with a boiling point of 200° C. or higher and 300° C. or lower, is a good solvent for the first component, and is at least one type selected from a group consisting of an aromatic hydrocarbon, an aromatic ether, and an aliphatic ether; in which the proportion of the second compound in a mixed solvent including the second component and the third component is 10 wt % or greater. In a case of including the third component, it is preferable that the boiling point of the second component be higher than the boiling point of the third component. In other words, the third component with a lower boiling point lower than the boiling point of the second component is selected from the above-described aromatic hydrocarbons, aromatic ethers, and aliphatic ethers.

Second Component

Examples of the aromatic hydrocarbon including two or more aromatic rings that is the second component with a boiling point (bp) of 280° C. or higher and 350° C. or lower include isopropylphenyl (bp. 300° C.) and 1,1-bis(3,4-dimethylphenylethane) (bp. 333° C.)

Similarly, examples of the aromatic glycol ether that is the second component include ethylene glycolmonphenyl ether (bp. 283° C.)

Similarly, examples of the aliphatic glycol ether that is a second component include tetraethylene monobutyl ether (bp. 304° C.)

Similarly, examples of the aliphatic acetate that is the second component include tributyrin (bp. 305° C.)

Similarly, examples of the aliphatic ester that is the second component include triethylene glycol bis(2-ethylhexanoate) (bp. 344° C.)

Third Component

Examples of the aromatic hydrocarbon that is the third component with a boiling point (bp) of 200° or more and 300° or less, 1,4-diisopropyl benzene (bp. 205° C.), cyclohexyl benzene (bp. 236° C.), nonyl benzene (bp. 282° C.) and decyl benzene (bp. 298° C.).

Similarly, examples of the aromatic ether that is the third component include 3-phenoxytoluene.

Similarly, examples of the aliphatic ether that is the third component include diethyleneglycol butyl methylether (bp. 210° C.) and diethyleneglycol dibutyl ether (bp. 256° C.)

Although the solvent given as an example of the third component lowers in viscosity as the boiling point increases, the viscosity of any of them is lower than 10 cp. Meanwhile, the solvent given as an example of the second component has a higher boiling point than the third component and a viscosity of 10 cp or higher (refer to FIGS. 5A and 5B). The viscosity of the solvent given as an example of the second component, even though the viscosity also increases as the boiling point generally increases the ethylene glycol monophenyl ether (viscosity 25.2 cp) with a boiling point of 283° C. is an example with a higher viscosity with respect to tributin (viscosity 17.5 cp) with a boiling point of 305° C. The triethylene glycol bis(2-ethylhexanoate) (viscosity 15.8 cp) with a boiling point of 344° C. is an example with a lower viscosity with respect to tributin (viscosity 17.5 cp) with a boiling point of 305° C.

It is preferable that the ink for functional layer formation suitable to the ink jet method (liquid droplet discharge method) have a viscosity of 40 cp or lower, taking the discharge characteristics from the ink jet head 20 into consideration. Meanwhile, when the viscosity of the ink for functional layer formation is lower than 10 cp, since fluidity of the ink for functional layer formation is high when if the first component is included as the solute, seeping up the side wall of the partition wall 106 when the opening portion 106a is coated is considered. If the fluidity of the ink for functional layer formation is high and the boiling point low, in cases in which the drying proceeds from the end of the coating region in the step for drying the ink for functional layer formation, the solute first solidifies in parts in which the solvent evaporates, and the solute does not easily remain in parts in which the solvent is evaporated from the rear, and a so-called coffee stain phenomenon easily arises. That is, irregularities in the film thickness of the functional layer easily occur.

The present inventors developed the selection of the second component and combination of second component and the third component that does not easily seep up the side wall of the partition wall 106 such that the cross-sectional shape of in the opening portion 106a surrounded by the partition wall 106 after drying, along with application to the ink jet method (liquid droplet discharge method) so as to become flat.

Figure 4:
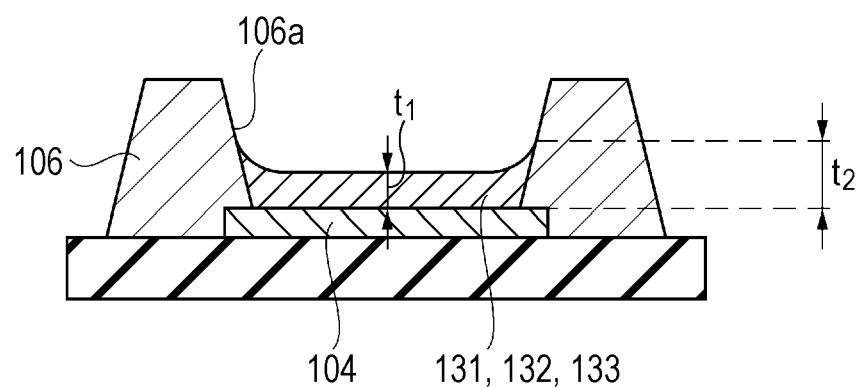
FIG. 4 is a view for describing an evaluation method according to the film flatness of the functional layer.

Below, specific examples and comparative examples of the ink for functional layer formation will be provided, and the specific constitutions and effects of the ink for functional layer formation will be described with respect to FIGS. 4 to 7. FIG. 4 is a diagram for describing an evaluation method according to the film flatness of the functional layer, FIG. 5A is a table showing the constitutions and evaluation results of an ink for functional layer formation in Examples 1 to 6 and Comparative Examples 1 to 7, FIG. 5B is a table showing the constitution and evaluation results of an ink for functional layer formation according to Examples 7 to 12 and Comparative Examples 8 to 14. FIGS. 6A to 6D are tables showing the constitution and evaluation results of the ink for functional layer formation of Examples 13 to 31 and Comparative Examples 15 to 19. FIGS. 7E to 7G are tables showing the constitution and evaluation results of the ink for functional layer formation of Examples 32 to 35 and Comparative Examples 20 to 33.

The evaluation criteria of the ink for functional layer formation naturally include suitability to being used in an ink jet method (liquid droplet discharge method) and the cross-sectional shape of the functional layer after film formation (after drying) being flat. In the embodiment, as shown in FIG. 4, the film flatness of each layer is evaluated when the hole injection layer (HIL), the hole transporting layer (HTL), and the light emitting layer (EML) are formed in the opening portion 106a including the pixel electrode 104 surrounded by the partition wall 106 on the element substrate 101. Specifically, the film flatness is evaluated by comparing the film thickness $t_1$ of central portion of the functional layer on the pixel electrode 104 of the opening portion 106a and the film thickness $t_2$ of the functional layer in the case of the partition wall 106. In the evaluation of the film flatness, when $t_2 \leq 2t_1$ is rated A, $2t_1 < t_2 \leq 3t_1$ is rated B, $3t_1 < t_2 \leq 4t_1$ is rated C, and $4t_1 \leq t_2$ is rated D.

FIG. 4 shows the cross-sectional shape of the functional layer in the short direction of the central portion of the sub-pixel 110 (refer to FIG. 1) that is substantially rectangular in plan view. Since the film thickness distribution in the short direction of the opening portion 106a is easily influenced by ink for functional layer formation seeping up the side wall of the partition wall 106 than the film thickness distribution in the length direction of the opening portion 106a, the film thickness distribution in the short direction is the evaluation target.

The cross-sectional shape of the functional layer in the short direction is not necessarily limited to a concave shape seeping up the partition wall 106 side as shown in FIG. 4. The cross-sectional shape of the functional layer may also be a convex shape or a letter M shape. Accordingly, the film thickness $t_1$ is the film thickness of the part of the cross-sectional shape of the functional layer in the opening portion 106a at which the film thickness is thought the smallest, and the film thickness $t_2$ is defined as the film thickness of the part in the cross-sectional shape of the functional layer in the opening portion 106a at which the film thickness is thought to be the greatest. Measurement of the film thickness of the functional layer in the embodiment is performed using a probe type step profiler.

The evaluation criteria of the ink for functional layer formation include the solubility with respect to the solvent of the first component. For the fluidity, a solvent that dissolves 1.5 wt % or greater of the first component is rated A, a solvent that dissolves 0.5 wt % or greater and up to 1.5 wt % of the first component is rated B, a solvent that dissolves up to 0.5 wt % of the first component is rated C, and a solvent in which the first component is insoluble is rated D. Because any of the examples and comparative examples of the ink for functional layer formation of the embodiment use a good solvent that dissolves the first component, the evaluation for all thereof is rated B or A. In the embodiment, a solvent that dissolves 0.5 wt % or greater of the first component is defined as a good solvent, and a solvent that dissolves less than 0.5 wt % of the first component is defined as a poor solvent.

Below, although the configuration and the evaluation results of the ink for functional layer formation of the examples and comparative examples will be described, here the ink for functional layer formation will be referred to simply as "ink".

EXAMPLE 1

As shown in FIG. 5A, the ink of Example 1 is an ink for hole injection layer formation in which 1.2 wt % of PVK (polyvinyl carbazole) that is a high molecular weight hole injection material as a first component is dissolved in ethylene glycol monophenyl ether with a boiling point of 283° C. as a second component. As described in the method for manufacturing an organic EL element 130 described above, the hole injection layer (HIL) is formed by coating and drying the ink of Example 1 on the opening portion 106a with the ink jet method. The solubility of the first component in the ink in Example 1 is rated A. The viscosity of the ethylene glycol-monophenyl ether of the second component is 25.2 cp (centipoise) at room temperature, and the ink of Example 1 is able to be discharged as liquid droplets without problem using the ink jet method. The film flatness of the hole injection layer (HIL) obtained after drying is rated B.

EXAMPLE 2

As shown in FIG. 5A, the ink of Example 2 uses isopropyl biphenyl with a boiling point of 300° C. and a viscosity at room temperature of 10.5 cp as the second component, and the other constitutions are the same as the ink of Example 1. The solubility of the first component in the ink of Example 2 is rated A, and discharging as liquid droplets with the ink jet method is possible without problems. The film flatness of the hole injection layer (HIL) obtained after drying is rated B.

EXAMPLE 3

As shown in FIG. 5A, the ink of Example 3 uses tetra-ethylene glycol monobutyl ether with a boiling point of 304° C. and a viscosity at room temperature of 14.0 cp as the second component, and the other constitutions are the same as the ink of Example 1. The solubility of the first component in the ink of Example 3 is rated B, and discharging as liquid droplets with the ink jet method is possible without problems. The film flatness of the hole injection layer (HIL) obtained after drying is rated B.

EXAMPLE 4

As shown in FIG. 5A, the ink of Example 4 uses tributyrin with a boiling point of 305° C. and a viscosity at room temperature of 17.5 cp as the second component, and the other constitutions are the same as the ink of Example 1. The solubility of the first component in the ink of Example 4 is rated B, and discharging as liquid droplets with the ink jet method is possible without problems. The film flatness of the hole injection layer (HIL) obtained after drying is rated B.

EXAMPLE 5

As shown in FIG. 5A, the ink of Example 5 uses 1,1-bis (3,4-dimethyl phenyl ethane) with a boiling point of 333° C. and a viscosity at room temperature of 34.1 cp as the second component, and the other constitutions are the same as the ink of Example 1. The solubility of the first component in the ink of Example 5 is rated A, and discharging as liquid droplets with the ink jet method is possible without problems. The film flatness of the hole injection layer (HIL) obtained after drying is rated A.

EXAMPLE 6

As shown in FIG. 5A, the ink of Example 6 uses triethylene glycol bis(2-ethyl hexanoate) with a boiling point of 344° C. and a viscosity at room temperature of 15.8 cp as the second component, and the other constitutions are the same as the ink of Example 1. The solubility of the first component in the ink of Example 6 is rated B, and discharging as liquid droplets with the ink jet method is possible without problems. The film flatness of the hole injection layer (HIL) obtained after drying is rated B.

COMPARATIVE EXAMPLE 1

As shown in FIG. 5A, the ink of Comparative Example 1 uses diethylene glycol butyl methyl ether with a boiling point of 210° C. and a viscosity at room temperature of 2.0 cp as the second component, and the other constitutions are the same as Example 1. Even though the solubility of the first component in the ink of Comparative Example 1 is rated B, and discharging as liquid droplets with the ink jet method is possible without problems, the film flatness of the hole injection layer (HIL) obtained after drying is rated D.

COMPARATIVE EXAMPLE 2

As shown in FIG. 5A, the ink of Comparative Example 2 uses diethylene glycol dibutyl ether with a boiling point of 256° C. and a viscosity at room temperature of 2.4 cp as the second component, and the other constitutions are the same as Example 1. Even though the solubility of the first component in the ink of Comparative Example 2 is rated B, and discharging as liquid droplets with the ink jet method is possible without problems, the film flatness of the hole injection layer (HIL) obtained after drying is rated D.

COMPARATIVE EXAMPLE 3

As shown in FIG. 5A, the ink of Comparative Example 3 uses 1,4-diisopropyl benzene with a boiling point of 205° C. and a viscosity at room temperature of 1.9 cp as the second component, and the other constitutions are the same as Example 1. Even though the solubility of the first component in the ink of Comparative Example 3 is rated B, and discharging as liquid droplets with the ink jet method is possible without problems, the film flatness of the hole injection layer (HIL) obtained after drying is rated D.

COMPARATIVE EXAMPLE 4

As shown in FIG. 5A, the ink of Comparative Example 4 uses cyclohexyl benzene with a boiling point of 236° C. and a viscosity at room temperature of 2.6 cp as the second component, and the other constitutions are the same as Example 1. Even though the solubility of the first component in the ink of Comparative Example 4 is rated A, and discharging as liquid droplets with the ink jet method is possible without problems, the film flatness of the hole injection layer (HIL) obtained after drying is rated D.

COMPARATIVE EXAMPLE 5

As shown in FIG. 5A, the ink of Comparative Example 5 uses nonyl benzene with a boiling point of 282° C. and a viscosity at room temperature of 6.0 cp as the second component, and the other constitutions are the same as Example 1. Even though the solubility of the first component in the ink of Comparative Example 5 is rated A, and discharging as liquid droplets with the ink jet method is possible without problems, the film flatness of the hole injection layer (HIL) obtained after drying is rated D.

COMPARATIVE EXAMPLE 6

As shown in FIG. 5A, the ink of Comparative Example 6 uses decyl benzene with a boiling point of 298° C. and a viscosity at room temperature of 8.0 cp as the second component, and the other constitutions are the same as Example 1. Even though the solubility of the first component in the ink of Comparative Example 6 is rated B, and discharging as liquid droplets with the ink jet method is possible without problems, the film flatness of the hole injection layer (HIL) obtained after drying is rated D.

COMPARATIVE EXAMPLE 7

As shown in FIG. 5A, the ink of Comparative Example 7 uses 3-phenoxy toluene with a boiling point of 272° C. and a viscosity at room temperature of 5.8 cp as the second component, and the other constitutions are the same as Example 1. Even though the solubility of the first component in the ink of Comparative Example 7 is rated A, and discharging as liquid droplets with the ink jet method is possible without problems, the film flatness of the hole injection layer (HIL) obtained after drying is rated D.

The inks of Examples 1 to 6 use a good solvent that dissolves the first component as the second component, and the boiling points are 280° C. or higher and 350° C. or lower, and viscosities are 10 cp or higher and 40 cp or lower. Accordingly, the fluidity of the ink is low, and does not easily seep up the partition wall 106. Since the drying proceeds slowly, it is thought that a hole injection layer (HIL) having excellent film flatness is obtained after drying.

In contrast, although the inks of Comparative Examples 1 to 7 use a good solvent that dissolves the first component as the second component, the boiling points are lower than 300° C. and the viscosities are lower than 10 cp. Accordingly, since the fluidity of the ink is high and the drying proceeds in a state of seeping up the partition wall 106, the film flatness of the hole injection layer (HIL) is thought to be lowered compared to Comparative Examples 1 to 6.

In Examples 1 to 6 and Comparative Examples 1 to 7, even if the inks are configured respectively using the above-described CuPc, TAPC, TPD, α-NPD, m-MTDATA, 2-TNATA, TCTA, TDAPB, spiro-TAD, DPPD, DTP, HTM1, HTM2, TPT1, TPTE which are hole injection materials as the first component with the same solvent constitution, the same film flatness results as cases of using a high molecular weight hole injection material are obtained.

In Examples 1 to 6 and Comparative Examples 1 to 7, even if the hole transporting layer (HTL) is formed using ink in which 0.5 wt % of PF, PPV, PMPS, Poly[N,N'-bis(4-butylphenyl)-N,N'-bis(phenyl)-benzidine], and TFB which are polymer hole transporting materials as the first component are respectively dissolved with respect to solvent of the second component, the same film flatness results as cases of forming the hole injection layer (HIL) are obtained. The hole transporting layer (HTL) is formed by coating ink on the hole transporting layer (HIL). The hole injection layer (HIL) in this case is formed using the ink of Example 5 with a film flatness evaluation of A. In a case of forming the hole transporting layer (HTL) using TFB, after decompression drying, the coating layer is fired by heating for one hour at 180° C. in a nitrogen atmosphere, and the hole transporting layer (HTL) formed from TFB insoluble in an organic solvent is formed by removing the TFB soluble layer through a xylene solvent.

Since it is possible to also use the low molecular weight hole injection material as the hole transporting material, even if the hole transporting layer (HTL) is formed using the low molecular weight hole injection material as the first component on the hole injection layer (HIL) using the high molecular weight hole injection material, approximately the same film flatness results are obtained.

The hole injection layer (HIL) and the hole transporting layer (HTL) may be formed by combining a high molecular weight material and a low molecular weight material, and in this case as well, it is thought that the same film flatness results as Examples 1 to 6 and Comparative Examples 1 to 7 are obtained. Since the mixing ratio of the high molecular weight material and the low molecular weight material depends on the carrier balance between the holes and electrons in the functional layer, and although not particularly limited, it is preferable that 30 wt % or greater of the high molecular weight material be included with respect to the total weight of the high molecular weight material and the low molecular weight material from the viewpoint of stable film formation.

Next, the inks of Examples 7 to 12 and Comparative Examples 8 to 14 with the light emitting layer forming material as the first component will be described with reference to FIG. 5B.

EXAMPLE 7

As shown in FIG. 5B, the ink of example 7 is an ink for light emitting layer formation in which 1.0 wt % of poly(9,9-dihexylfluorenyl-2,7-diyl) that is a high molecular weight light emitting layer forming material as a first component is dissolved in ethylene glycol monophenyl ether with a boiling point of 283° C. as a second component. As described in the method for manufacturing an organic EL element 130 described above, the light emitting layer (EML) is formed by coating and drying the ink of Example 7 on the opening portion 106a with the ink jet method. The solubility of the first component in the ink in Example 7 is rated A. The viscosity of the ethylene glycol-monophenyl ether of the second component is 25.2 cp (centipoise) at room temperature, and discharge is possible as liquid droplets without problem using the ink jet method. The film flatness of the light emitting layer (EML) obtained after drying is rated B. The light emitting layer (EML) is formed by coating a drying the ink of Example 7 with respect to hole injection layer (HIL) and the hole transporting layer (HTL) formed by layering in the opening portion 106a. The hole injection layer (HIL) in this case is formed using the ink of Example 5. The hole transporting layer (HTL) uses TFB as the first component in the ink constitution of Example 5. That is, the light emitting layer (EML) using poly(9,9-dihexylfluorenyl-2,7-diyl) able to obtain blue light emission as the light emitting layer forming material is formed on the hole transporting layer (HTL) using TFB as the hole transporting material layered on the hole injection layer (HIL) using PVK as the hole injection material.

EXAMPLE 8

As shown in FIG. 5B, the ink of Example 8 uses isopropyl biphenyl with a boiling point of 300° C. and a viscosity at room temperature of 10.5 cp as the second component, and the other constitutions are the same as the ink of Example 7. The solubility of the first component in the ink of Example 8 is rated A, and discharging as liquid droplets with the ink jet method is possible without problems. The film flatness of the light emitting layer (EML) obtained after drying is rated B.

EXAMPLE 9

As shown in FIG. 5B, the ink of Example 9 uses tetraethylene glycol monobutyl ether with a boiling point of 304° C. and a viscosity at room temperature of 14.0 cp as the second component, and the other constitutions are the same as the ink of Example 7. The solubility of the first component in the ink of Example 9 is rated B, and discharging as liquid droplets with the ink jet method is possible without problems. The film flatness of the light emitting layer (EML) obtained after drying is rated B.

EXAMPLE 10

As shown in FIG. 5B, the ink of Example 10 uses tributyrin with a boiling point of 305° C. and a viscosity at room temperature of 17.5 cp as the second component, and the other constitutions are the same as the ink of Example 7. The solubility of the first component in the ink of Example 10 is rated B, and discharging as liquid droplets with the ink jet method is possible without problems. The film flatness of the light emitting layer (EML) obtained after drying is rated B.

EXAMPLE 11

As shown in FIG. 5B, the ink of Example 11 uses 1,1-bis(3,4-dimethyl phenyl ethane) with a boiling point of 333° C. and a viscosity at room temperature of 34.1 cp as the second component, and the other constitutions are the same as the ink of Example 7. The solubility of the first component in the ink of Example 11 is rated A, and discharging as liquid droplets with the ink jet method is possible without problems. The film flatness of the light emitting layer (EML) obtained after drying is rated A.

EXAMPLE 12

As shown in FIG. 5B, the ink of Example 12 uses triethylene glycol bis(2-ethyl hexanoate) with a boiling point of 344° C. and a viscosity at room temperature of 15.8 cp as the second component, and the other constitutions are the same as the ink of Example 7. The solubility of the first component in the ink of Example 12 is rated B, and discharging as liquid droplets with the ink jet method is possible without problems. The film flatness of the light emitting layer (EML) obtained after drying is rated B.

COMPARATIVE EXAMPLE 8

As shown in FIG. 5B, the ink of Comparative Example 8 uses diethylene glycol butyl methyl ether with a boiling point of 210° C. and a viscosity at room temperature of 2.0 cp as the second component, and the other constitutions are the same as Example 7. Even though the solubility of the first component in the ink of Comparative Example 8 is rated B, and discharging as liquid droplets with the ink jet method is possible without problems, the film flatness of the light emitting layer (EML) obtained after drying is rated D.

COMPARATIVE EXAMPLE 9

As shown in FIG. 5B, the ink of Comparative Example 9 uses diethylene glycol dibutyl ether with a boiling point of 256° C. and a viscosity at room temperature of 2.4 cp as the second component, and the other constitutions are the same as Example 7. Even though the solubility of the first component in the ink of Comparative Example 9 is rated B, and discharging as liquid droplets with the ink jet method is possible without problems, the film flatness of the light emitting layer (EML) obtained after drying is rated D.

COMPARATIVE EXAMPLE 10

As shown in FIG. 5B, the ink of Comparative Example 10 uses 1,4-diisopropyl benzene with a boiling point of 205° C. and a viscosity at room temperature of 1.9 cp as the second component, and the other constitutions are the same as Example 7. Even though the solubility of the first component in the ink of Comparative Example 10 is rated B, and discharging as liquid droplets with the ink jet method is possible without problems, the film flatness of the light emitting layer (EML) obtained after drying is rated D.

COMPARATIVE EXAMPLE 11

As shown in FIG. 5B, the ink of Comparative Example 11 uses cyclohexyl benzene with a boiling point of 236° C. and a viscosity at room temperature of 2.6 cp as the second component, and the other constitutions are the same as Example 7. Even though the solubility of the first component in the ink of Comparative Example 11 is rated A, and discharging as liquid droplets with the ink jet method is possible without problems, the film flatness of the light emitting layer (EML) obtained after drying is rated D.

COMPARATIVE EXAMPLE 12

As shown in FIG. 5B, the ink of Comparative Example 12 uses nonyl benzene with a boiling point of 282° C. and a viscosity at room temperature of 6.0 cp as the second component, and the other constitutions are the same as Example 7. Even though the solubility of the first component in the ink of Comparative Example 12 is rated A, and discharging as liquid droplets with the ink jet method is possible without problems, the film flatness of the light emitting layer (EML) obtained after drying is rated D.

COMPARATIVE EXAMPLE 13

As shown in FIG. 5B, the ink of Comparative Example 13 uses decyl benzene with a boiling point of 298° C. and a viscosity at room temperature of 8.0 cp as the second component, and the other constitutions are the same as Example 7. Even though the solubility of the first component in the ink of Comparative Example 13 is rated B, and discharging as liquid droplets with the ink jet method is possible without problems, the film flatness of the light emitting layer (EML) obtained after drying is rated D.

COMPARATIVE EXAMPLE 14

As shown in FIG. 5B, the ink of Comparative Example 14 uses 3-phenoxy toluene with a boiling point of 272° C. and a viscosity at room temperature of 5.8 cp as the second component, and the other constitutions are the same as Example 7. Even though the solubility of the first component in the ink of Comparative Example 14 is rated A, and discharging as liquid droplets with the ink jet method is possible without problems, the film flatness of the light emitting layer (EML) obtained after drying is rated D.

The inks of Examples 7 to 12 use a good solvent that dissolves the first component as the second component, and the boiling points are 280° C. or higher and 350° C. or lower, and viscosities are 10 cp or higher and 40 cp or lower. Accordingly, the fluidity of the ink is low, and does not easily seep up the partition wall 106. Since the drying proceeds slowly, it is thought that a light emitting layer (EML) having excellent film flatness is obtained after drying.

In contrast, although the inks of Comparative Examples 8 to 14 use a good solvent that dissolves the first component as the second component, the boiling points are lower than 300° C. and the viscosities are lower than 10 cp. Accordingly, compared to the inks of Examples 7 to 12, since the fluidity of the ink is high and the drying proceeds in a state of seeping up the partition wall 106, the film flatness of the light emitting layer (EML) is thought to be lowered.

In Examples 7 to 12 and Comparative Examples 8 to 14, even if the light emitting layer (EML) is formed using Poly[{9,9-dihexyl-2,7-bis(1-cyanovinylene)fluorenyl-ene}-alt-co-{2,5-bis(N,N'-diphenylamino)-1,4-phenylene}] that is able to obtain red light emission or Poly[(9,9-dioctylfluorenyl-2,7-diyl)-co-(N,N'-diphenyl)-N,N'-di(p-butylphenyl) 1,4-diamino-benzene] that is able to obtain green light emission which are high molecular weight light emitting layer forming materials as a first component, the same film flatness results as the case of using poly(9,9-dihexylfluorenyl-2,7-diyl) are obtained.

In Examples 7 to 12 and Comparative Examples 8 to 14, even if the light emitting layer (EML) is formed using a light emitting layer forming material including a low molecular weight host material and guest material (dopant) as a first component, the same film flatness results as the case of using poly(9,9-dihexylfluorenyl-2,7-diyl) are obtained. In this case, examples of the low molecular weight host material include CBP, BAlq, mCP, CDBP, DCBP06, SimCP, UGH3, TDAPB, as shown in FIG. 5B. Examples of the low molecular guest material include iridium compounds or platinum compounds, such as Bt2Ir(acac), and Btp2Ir(acac), PtOEP that are red guest materials, Ir(ppy)3, and Ppy2Ir (acac) that are green guest materials, and FIrpic, Ir(pmb)3, FIrN4, and FIrtaz that are blue guest materials.

It is thought that the same film flatness results are obtained even if a high molecular weight host material and a low molecular weight guest material (dopant) are combined. The host material may combine high molecular weight materials and low molecular weight materials.

The evaluation results of the inks of Examples 1 to 12 and Comparative Examples 1 to 14 are collected as follows. As a good solvent that dissolves the first component, if the second component with a boiling point of 280° C. or higher and 350° C. or lower and a viscosity of 10 cp or higher and 40 cp or lower is selected from aromatic hydrocarbons having two or more aromatic rings, aromatic glycol ethers, aliphatic glycol ethers, aliphatic acetates, and aliphatic esters, the fluidity of the ink for functional layer formation is low and seeping up the partition wall 106 does not easily occur. Since the drying proceeds slowly, a functional layer having excellent film flatness is obtained after drying. In particular, in a case using 1,1-bis(3,4-dimethyphenylethane) with a boiling point of 300° C. or higher and a viscosity of 30 cp or higher as the second component, an excellent film flatness is obtained in the functional layer.

It is possible for the first component to be selected from either or both of a high molecular weight or low molecular weight organic semiconductor material.

Although one type of solvent is selected as the second component in Examples 1 to 12 and Comparative Examples 1 to 14, there is no limitation thereto. The second component with a boiling point of 280° C. or higher and 350° C. or lower may be selected from at least one of aromatic hydrocarbons including at least two aromatic rings, aromatic glycol ethers, aliphatic glycol ethers, aliphatic acetates, and aliphatic esters, and even if a mixed solvent is used by selecting plural types, it is thought the above effects are obtained.

Next, Examples 13 to 35 and Comparative Examples 15 to 33 of the ink for functional layer formation further including the third component that is a good solvent that dissolves the first component will be described with reference to FIGS. 6A to 7G. The third component is selected from at least one of aromatic hydrocarbons, aromatic ethers, and aliphatic ethers with a boiling point 200° C. or higher and 300° C. or lower. Since the second component and third component are selected from any good solvent that dissolves the first component and solubility is not a problem, only the film flatness is evaluated.

EXAMPLE 13

As shown in FIG. 6A, the ink of Example 13 is an ink for hole injection layer formation in which approximately 1.2 wt % of PVK (polyvinyl carbazole) that is a high molecular weight hole injection material as a first component is dissolved in a mixed solvent of ethylene glycol monophenyl ether with a boiling point of 283° C. that is a second component and 1,4-diisopropyl benzene with a boiling point of 205° C. that is a third component. The boiling point of the second component is higher than the boiling point of the third component, and the difference between the boiling points is 78° C. The ratio (second component:third component) of the second component and the third component in the mixed solvent is adjusted to 9 levels of ink of 10:90, 20:80, 30:70, 40:60, 50:50, 60:40, 70:30, 80:20 and 90:10.

As described in the method for manufacturing an organic EL element 130 described above, the hole injection layer (HIL) is formed by coating and drying each of nine levels of ink of Example 13 on the opening portion 106a with the ink jet method. By adding 1,4-diisopropyl benzene (third component) with a viscosity at room temperature of 1.9 cp to ethylene glycol-monophenyl ether (second component) with a viscosity at room temperature of 25.2 cp, it is possible to attain a state suitable to the ink jet method by lowering the viscosity of the ink and for the nine levels of ink in Example 13 to be each discharged as liquid droplets without problems. In each of the nine levels of ink of Example 13, the film flatness of the hole injection layer (HIL) obtained after drying is rated B.

Also in the case of Example 13, similarly to Examples 1 to 12, even when the first component that is a solute is any of the hole injection layer forming material, hole transporting layer forming material, or light emitting layer forming material, or a combination of either or both of a high molecular weight material and a low molecular weight material, the same film flatness results are obtained. In the following description of the examples and comparative examples, selection of the first component is basically the same as Examples 1 to 12, and detailed description will not be provided. Accordingly, the term functional layer in the description below indicates any of the hole injection layer (HIL), hole transporting layer (HTL), or light emitting layer (EML).

EXAMPLE 14

As shown in FIG. 6A, the ink of Example 14 uses isopropyl biphenyl with a boiling point of 300° C. as a second component with respect to the ink in Example 13. Other constitutions are the same as Example 13. The boiling point of the second component is higher than the boiling point of the third component, and the difference between the boiling points is 95° C. By adding 1,4-diisopropyl benzene (third component) with a viscosity at room temperature of 1.9 cp to isopropyl biphenyl (second component) with a viscosity at room temperature of 10.5 cp, it is possible to attain a state suitable to the ink jet method by lowering the viscosity of the ink and for the nine levels of ink in Example 14 to be each discharged as liquid droplets without problems. In each of the nine levels of ink of Example 14, the film flatness of the functional layer obtained after drying is rated B.

EXAMPLE 15

As shown in FIG. 6A, the ink of Example 15 uses tetraethylene glycol monobutyl ether with a boiling point of 304° C. as a second component with respect to the ink in Example 13. Other constitutions are the same as Example 13. The boiling point of the second component is higher than the boiling point of the third component, and the difference between the boiling points is 99° C. By adding 1,4-diisopropyl benzene (third component) with a viscosity at room temperature of 1.9 cp to tetraethylene glycol-monophenyl ether (second component) with a viscosity at room temperature of 14.0 cp, it is possible to attain a state suitable to the ink jet method by lowering the viscosity of the ink and for the nine levels of ink in Example 15 to be each discharged as liquid droplets without problems. In each of the nine levels of ink of Example 15, the film flatness of the functional layer obtained after drying is rated B.

EXAMPLE 16

As shown in FIG. 6A, the ink of Example 16 uses tributyrin with a boiling point of 305° C. as a second component with respect to the ink in Example 13. Other constitutions are the same as Example 13. The boiling point of the second component is higher than the boiling point of the third component, and the difference between the boiling points is 100° C. By adding 1,4-diisopropyl benzene (third component) with a viscosity at room temperature of 1.9 cp to tributyrin (second component) with a viscosity at room temperature of 17.5 cp, it is possible to attain a state suitable to the ink jet method by lowering the viscosity of the ink and for the nine levels of ink in Example 16 to be each discharged as liquid droplets without problems. In each of the nine levels of ink of Example 16, the film flatness of the functional layer obtained after drying is rated B.

EXAMPLE 17

As shown in FIG. 6A, the ink of Example 17 uses 1,1,-bis(3,4-dimethyl phenyl ethane) with a boiling point of 333° C. as a second component with respect to the ink in Example 13. Other constitutions are the same as Example 13. The boiling point of the second component is higher than the boiling point of the third component, and the difference between the boiling points is 128° C. By adding 1,4-diisopropyl benzene (third component) with a viscosity at room temperature of 1.9 cp to 1,1-bis(3,4-dimethyl phenyl ethane) (second component) with a viscosity at room temperature of 34.1 cp, it is possible to attain a state suitable to the ink jet method by lowering the viscosity of the ink and for the nine levels of ink in Example 17 to be each discharged as liquid droplets without problems. In each of the nine levels of ink of Example 17, the film flatness of the functional layer obtained after drying is rated A.

EXAMPLE 18

As shown in FIG. 6A, the ink of Example 18 uses triethylene glycol bis(2-ethylhexanoate) with a boiling point of 344° C. as a second component with respect to the ink in Example 13. Other constitutions are the same as Example 13. The boiling point of the second component is higher than the boiling point of the third component, and the difference between the boiling points is 139° C. By adding 1,4-diisopropyl benzene (third component) with a viscosity at room temperature of 1.9 cp to triethylene glycol bis(2-ethylhexanoate) (second component) with a viscosity at room temperature of 15.8 cp, it is possible to attain a state suitable to the ink jet method by lowering the viscosity of the ink and for the nine levels of ink in Example 18 to be each discharged as liquid droplets without problems. In each of the nine levels of ink of Example 18, the film flatness of the functional layer obtained after drying is rated B.

EXAMPLE 19 TO EXAMPLE 24

As shown in FIG. 6B, the ink in Examples 19 to 24 includes a predetermined weight (wt %) of the first component dissolved in a mixed solvent of each of the six types of the second component [ethylene glycol monophenyl ether (bp. 283° C.), isopropyl biphenyl (bp. 300° C.), tetraethylene glycol monobutyl ether (bp. 304° C.), tributyrin (bp. 305° C.), 1,1-bis(3,4-dimethyl phenyl ethane) (bp. 333° C.), triethylene glycol bis(2-ethylhexanoate) (bp. 344° C.)] and diethylene glycol butylmethyl ether (bp. 210° C.) as the third component. The boiling point of the second component is higher than the boiling point of the third component, and the differences between the boiling points are, in order from Example 19, 73° C., 90° C., 94° C., 95° C., 123° C., and 134° C. Since the viscosity at room temperature of the diethylene glycol butyl methylether that is the third component is 2.4 cp and is lower than that of the second component that, by adding the third component, it is possible to attain a state suitable to the ink jet method by lowering the viscosity of the ink and for the nine levels of ink in Examples 19 to 24 to be each discharged as liquid droplets without problems. In each of the nine levels of ink of Examples 19 to 22, and 24 the film flatness of the functional layer obtained after drying is rated B. In each of the nine levels of ink of Example 23 the film flatness of the functional layer obtained after drying is rated A.

COMPARATIVE EXAMPLE 15

As shown in FIG. 6C, the ink of Comparative Example 15 has cyclohexyl benzene with a boiling point of 236° C. selected as a third component with respect to the ink in Example 13. Other constitutions are the same as Example 13. The boiling point of the second component is higher than the boiling point of the third component, and the difference between the boiling points is 47° C. Since the viscosity at room temperature of the cyclohexyl benzene that is the third component is 2.6 cp and lower than that of the second component, by adding the third component, it is possible to attain a state suitable to the ink jet method by lowering the viscosity of the ink and for the nine levels of ink in Comparative Example 15 to be each discharged as liquid droplets without problems. However, the film flatness of the functional layer is rated D at two levels of the second component:third component ratios of 10:90 and 20:80, C at the four levels of 30:70, 40:60, 50:50, and 60:40, and B at the three levels of 70:30, 80:20, and 90:10.

EXAMPLES 25 TO 29

As shown in FIG. 6C, the ink in Examples 25 to 29 includes a predetermined weight (wt %) of the first component dissolved in a mixed solvent of each of the five types of the second component [isopropyl biphenyl (bp. 300° C.), tetraethylene glycol monobutyl ether (bp. 304° C.), tributyrin (bp. 305° C.), 1,1-bis(3,4-dimethyl phenyl ethane) (bp. 333° C.), triethylene glycol bis(2-ethylhexanoate) (bp. 344° C.)] and cyclohexyl benzene (bp. 236° C.) as the third component. The boiling point of the second component is higher than the boiling point of the third component, and the differences between the boiling points are, in order from Example 25, 64° C., 68° C., 69° C., 97° C., and 108° C. Since the viscosity at room temperature of the cyclohexyl benzene that is the third component is 2.6 cp and is lower than that of the second component, by adding the third component, it is possible to attain a state suitable to the ink jet method by lowering the viscosity of the ink and for the nine levels of ink in Examples 25 to 29 to be each discharged as liquid droplets without problems. In each of the nine levels of ink of Examples 25 to 27, and 29 the film flatness of the functional layer obtained after drying is rated B. In each of the nine levels of ink of Example 28, the film flatness of the functional layer obtained after drying is rated A.

COMPARATIVE EXAMPLES 16 TO 19

As shown in FIG. 6D, the ink in Comparative Examples 16 to 19 includes a predetermined weight (wt %) of the first component dissolved in a mixed solvent of each of the four types of the second component [ethylene glycol monophenyl ether (bp. 283° C.), isopropyl biphenyl (bp. 300° C.), tetraethylene glycol monobutyl ether (bp. 304° C.), tributyrin (bp. 305° C.) and diethylene glycol dibutyl ether (bp. 256° C.) as the third component. The boiling point of the second component is higher than the boiling point of the third component, and the differences between the boiling points are, in order from Comparative Example 16, 27° C., 44° C., 48° C., and 49° C. Since the viscosity at room temperature of the diethylene glycol dibutyl ether that is the third component is 2.4 cp and lower than that of the second component, by adding the third component, it is possible to attain a state suitable to the ink jet method by lowering the viscosity of the ink and for the nine levels of ink in Comparative Examples 16 to 19 to be each discharged as liquid droplets without problems. Meanwhile, the film flatness of the functional layer in Comparative Example 16 is rated D at the five levels of the second component:third component ratios of 10:90, 20:80, 30:70, 40:60, and 50:50, C at the two levels of 60:40 and 70:30, and B at the two levels of 80:20, and 90:10. In Comparative Examples 17 to 19, the film flatness is rated D at second component:third component ratios of 10:90, C at the five levels of 20:80, 30:70, 40:60, 50:50, and 60:40, and B at the three levels of 70:30, 80:20, and 90:10.

EXAMPLES 30 AND 31

As shown in FIG. 6D, the ink in Examples 30 and 31 includes a predetermined weight (wt %) of the first component dissolved in a mixed solvent of each of the two types of the second component [1,1-bis(3,4-dimethyl phenyl ethane) (bp. 333° C.), triethylene glycol bis(2-ethylhexanoate) (bp. 344° C.)] and diethylene glycol dibutyl ether (bp. 256° C.) as the third component. The boiling point of the second component is higher than the boiling point of the third component, and the difference between the boiling points is 77° C. for Example 30 and 88° C. for Example 31. Since the viscosity at room temperature of the diethylene glycol dibutyl ether that is the third component is 2.4 cp and lower than that of the second component, by adding the third component, it is possible to attain a state suitable to the ink jet method by lowering the viscosity of the ink and for the nine levels of ink in Examples 30 and 31 to be each discharged as liquid droplets without problems. The film flatness of the functional layer is rated A for each of the nine levels of ink in Example 30. In Example 31, the 9 levels of ink are similarly B.

COMPARATIVE EXAMPLES 20 TO 23

As shown in FIG. 7E, the ink in Comparative Examples 20 to 23 includes a predetermined weight (wt %) of the first component dissolved in a mixed solvent of each of the four types of the second component [ethylene glycol monophenyl ether (bp. 283° C.), isopropyl biphenyl (bp. 300° C.), tetraethylene glycol monobutyl ether (bp. 304° C.), tributyrin (bp. 305° C.), and 3-phenoxytoluene (bp. 272° C.) as the third component. The boiling point of the second component is higher than the boiling point of the third component, and the difference between the boiling points, in order from Comparative Example 20, is 11° C., 28° C., 32° C., and 33° C. Since the viscosity at room temperature of the 3-phenoxytoluene that is the third component is 5.8 cp and lower than that of the second component, by adding the third component, it is possible to attain a state suitable to the ink jet method by lowering the viscosity of the ink and for the nine levels of ink in Comparative Examples 20 to 23 to be each discharged as liquid droplets without problems. Meanwhile, the film flatness of the functional layer in Comparative Example 20 is rated D at eight levels of the second component:third component ratios of 10:90, 20:80, 30:70, 40:60, 50:50, 60:40, 70:30, and 80:20, and C at the level of 90:10. In Comparative Examples 21 to 23, the film flatness is rated D at the three levels of second component:third component ratios of 10:90, 20:80, and 30:70, C at the three levels of 40:60, 50:50, and 60:40, and B at the three levels of 70:30, 80:20, and 90:10.

EXAMPLES 32 AND 33

As shown in FIG. 7E, the ink in Examples 32 and 33 includes a predetermined weight (wt %) of the first component dissolved in a mixed solvent of each of the two types of the second component [1,1-bis(3,4-dimethyl phenyl ethane) (bp. 333° C.), and triethylene glycol bis(2-ethylhexanoate) (bp. 344° C.)] and 3-phenoxytoluene (bp. 272° C.) as the third component. The boiling point of the second component is higher than the boiling point of the third component, and the difference between the boiling points is 61° C. for Example 32 and 72° C. for Example 33. Since the viscosity at room temperature of the 3-phenoxytoluene that is the third component is 5.8 cp and lower than that of the second component, by adding the third component, it is possible to attain a state suitable to the ink jet method by lowering the viscosity of the ink and for the nine levels of ink in Examples 32 and 33 to be each discharged as liquid droplets without problems. Meanwhile, the film flatness of the functional layer is rated A for each of the nine levels of ink in Example 32. In Example 33, the 9 levels of ink are similarly B.

COMPARATIVE EXAMPLES 24 TO 27

As shown in FIG. 7F, the ink in Comparative Examples 24 to 27 includes a predetermined weight (wt %) of the first component dissolved in a mixed solvent of each of the four types of the second component [ethylene glycol monophenyl ether (bp. 283° C.), isopropyl biphenyl (bp. 300° C.), tetraethylene glycol monobutyl ether (bp. 304° C.), and tributyrin (bp. 305° C.), and nonyl benzene (bp. 282° C.) as the third component. The boiling point of the second component is higher than the boiling point of the third component, and the difference between the boiling points is, in order from Comparative Example 24, 1° C., 18° C., 22° C., and 23° C. Since the viscosity at room temperature of the nonyl benzene that is the third component is 6.0 cp and lower than that of the second component, by adding the third component, it is possible to attain a state suitable to the ink jet method by lowering the viscosity of the ink and for the nine levels of ink in Comparative Examples 24 to 27 to be each discharged as liquid droplets without problems. Meanwhile, the film flatness of the functional layer in Comparative Example 24 is rated D at eight levels of the second component:third component ratios of 10:90, 20:80, 30:70, 40:60, 50:50, 60:40, 70:30, and 80:20 and C at 90:10. In Comparative Example 25, the film flatness is rated D at six levels of second component:third component ratios of 10:90, 20:80, 30:70, 40:60, 50:50, and 60:40, C at two levels of 70:30 and 80:20, and B at 90:10. In Comparative Examples 26 and 27, the film flatness is rated D at the three levels of second component:third component ratio of 10:90, 20:80, and 30:70, C at the three levels of 40:60, 50:50, and 60:40, and B at the three levels of 70:30, 80:20, and 90:10.

EXAMPLES 34 AND 35

As shown in FIG. 7F, the ink in Examples 34 and 35 includes a predetermined weight (wt %) of the first component dissolved in a mixed solvent of each of the two types of the second component [1,1-bis(3,4-dimethyl phenyl ethane) (bp. 333° C.), and triethylene glycol bis(2-ethylhexanoate) (bp. 344° C.)] and nonyl benzene (bp. 282° C.) as the third component. The boiling point of the second component is higher than the boiling point of the third component, and the difference between the boiling points is 51° C. for Example 34, and 62° C. at Example 35. Since the viscosity at room temperature of the nonyl benzene that is the third component is 6.0 cp and lower than that of the second component, by adding the third component, it is possible to attain a state suitable to the ink jet method by lowering the viscosity of the ink and for the nine levels of ink in Examples 34 and 35 to be each discharged as liquid droplets without problems. The film flatness of the functional layer is rated A for each of the nine levels of ink in Example 34. In Example 35, the 9 levels of ink are similarly B.

COMPARATIVE EXAMPLES 28 TO 33

As shown in FIG. 7G, the ink in Examples 28 to 33 includes a predetermined weight (wt %) of the first component dissolved in a mixed solvent of each of the six types of the second component [ethylene glycol monophenyl ether (bp. 283° C.), isopropyl biphenyl (bp. 300° C.), tetraethylene glycol monobutyl ether (bp. 304° C.), tributyrin (bp. 305° C.), 1,1-bis(3,4-dimethyl phenyl ethane) (bp. 333° C.), and triethylene glycol bis(2-ethylhexanoate) (bp. 344° C.)] and decyl benzene (bp. 298° C.) as the third component. The boiling point of the second component is higher than the boiling point of the third component, and the difference between the boiling points, in order from Comparative Example 28, is −15° C., 2° C., 6° C., 7° C., 35° C., and 46° C. Since the viscosity at room temperature of the decyl benzene that is the third component is 8.0 cp and lower than that of the second component, by adding the third component, it is possible to attain a state suitable to the ink jet method by lowering the viscosity of the ink and for the nine levels of ink in Comparative Examples 28 to 33 to be each discharged as liquid droplets without problems. Meanwhile, the film flatness of the functional layer in Comparative Examples 28 and 29 is rated D at eight levels of the second component:third component ratios of 10:90, 20:80, 30:70, 40:60, 50:50, 60:40, 70:30, and 80:20, C at 90:10. In Comparative Examples 30 and 31, the film flatness is rated D at seven levels of the second component:third component ratios of 10:90, 20:80, 30:70, 40:60, 50:50, 60:40, and 70:30, C at 80:20, and B at 90:10. In Comparative Examples 32, the film flatness is rated D at a second component:third component ratio of 10:90, C at the three levels of 20:80, 30:70, and 40:60, and B at the two levels of 50:50 and 60:40, and A at the three levels of 70:30, 80:20, and 90:10. In Comparative Examples 33, the film flatness is rated D at a second component:third component ratio of 10:90, C at the five levels of 20:80, 30:70, 40:60, 50:50, and 60:40, and B at the three levels of 70:30, 80:20, and 90:10.

The evaluation results of the inks of Examples 13 to 35 and Comparative Examples 15 to 33 are collected as follows. The second component that is a good solvent that dissolves the first component, has a boiling point of 280° C. or higher and 350° C. or lower and a viscosity of 10 cp or higher and 40 cp or lower is at least one type selected from aromatic hydrocarbons having two or more aromatic rings, aromatic glycol ethers, aliphatic glycol ethers, aliphatic acetates, and aliphatic esters. The third component that is a good solvent for the first component and has a boiling point of 200° C. or higher and 300° C. or lower and a viscosity of lower than 10 cp is selected from at least one of aromatic hydrocarbons, aromatic ethers, and aliphatic ethers. The ink for functional layer formation with a proportion of the second component in the mixed solvent including the second component and the third component of 10 wt % or greater, and a difference in the boiling points of the second component and the third component is 50° C. or higher is easily adjusted to a viscosity suitable to the ink jet method compared to a case of the good solvent being only the second component. Since the fluidity of the ink for functional layer formation is low, seeping up the partition wall 106 does not easily occur, and drying proceeds slowly, a functional layer with excellent film flatness after drying is obtained.

It is possible for the first component to be selected from either or both of a high molecular weight or low molecular weight organic semiconductor material. In other words, a functional layer with a flat cross-sectional shape is obtained in the opening portion 106*a*, regardless of the magnitude of the molecular weight of the first component.

In the Comparative Examples 15 to 33, the evaluation of the film flatness becomes B or A as the proportion of the second component in the mixed solvent formed from the second component and the third component increases. However, since the proportion of the third component in these ink constitutions is lowered, the range of viscosity adjustment suitable to the ink jet method is narrowed, and, since there is concern of the discharge conditions and drying conditions used in the ink jet method being limited, cannot be said to be optimal.

Although one type of solvent is selected as the third component in Examples 13 to 35 and Comparative Examples 15 to 33, there is no limitation thereto. The third component with a boiling point 200° C. or higher and 300° C. or lower is selected from at least one of aromatic hydrocarbons, aromatic ethers, and aliphatic ethers, or a plurality of types of solvent may be selected. Even with a mixed solvent including plurality of types of solvent selected as the third component and the second component, it is thought that the above effects are obtained.

According to the first embodiment, the following effects can be obtained.

(1) The ink for functional layer formation of the embodiment includes a first component that is a solute; and a second component with a boiling point of 280° C. or higher and 350° C. or lower, is a good solvent for the first component, and is one type selected from among an aromatic hydrocarbon including at least two aromatic rings, aromatic glycol ether, aliphatic glycol ether, aliphatic acetate, and aliphatic ester. Accordingly, the fluidity of the ink for functional layer formation is low, and does not easily seep up the partition wall 106. Since the drying proceeds slowly, a functional layer having excellent film flatness is obtained after drying. It is possible for an organic semiconductor material as the first component to be selected from either or both of a high molecular weight or low molecular weight material. In other words, if the ink for functional layer formation of the embodiment is used, a functional layer with excellent film flatness after drying is obtained regardless of the type of first component or whether the first component is a high molecular weight material or a low molecular weight material.

(2) It is possible to provide an ink for functional layer formation with a viscosity adjustable to a state suitable to an ink jet method further including not only the second component, but also a third component with a boiling point of 200° C. or higher and 300° C. or lower, is a good solvent for the first component, and is one type selected from among an aromatic hydrocarbon, an aromatic ether, and an aliphatic ether; and in which the proportion of the second compound in a mixed solvent including the second component and the third component is 10 wt % or greater.

In the case of including the third component, it is preferable that the boiling point of the second component be higher than the boiling point of the third component, and that the difference in the boiling points between the second component and the third component be 50° C. or higher. By selecting such a second component and third component, since the second component sufficiently remains even if the third component is evaporated first in the drying step, drying proceeds slowly and a functional layer having an excellent film flatness after drying is obtained.

(3) According to the method of forming an organic EL element 130 using the ink for functional layer formation of the embodiment, since it is possible to form a functional layer 136 with a flat cross-sectional shape in the opening portion 106*a* surrounded by the partition wall 106, it is possible to form the organic EL element 130 with reduced brightness irregularities and color irregularities in light emission color, and excellent light emission characteristics.

(4) By the organic EL element 130 manufactured using the method for manufacturing an organic EL element 130 of the embodiment including each of the sub-pixels 110R, 110G, and 110B, it is possible to provide a top emission light emitting device 100 having excellent display quality (light emission characteristics).

Second Embodiment

Electronic Apparatus

Figure 8A:
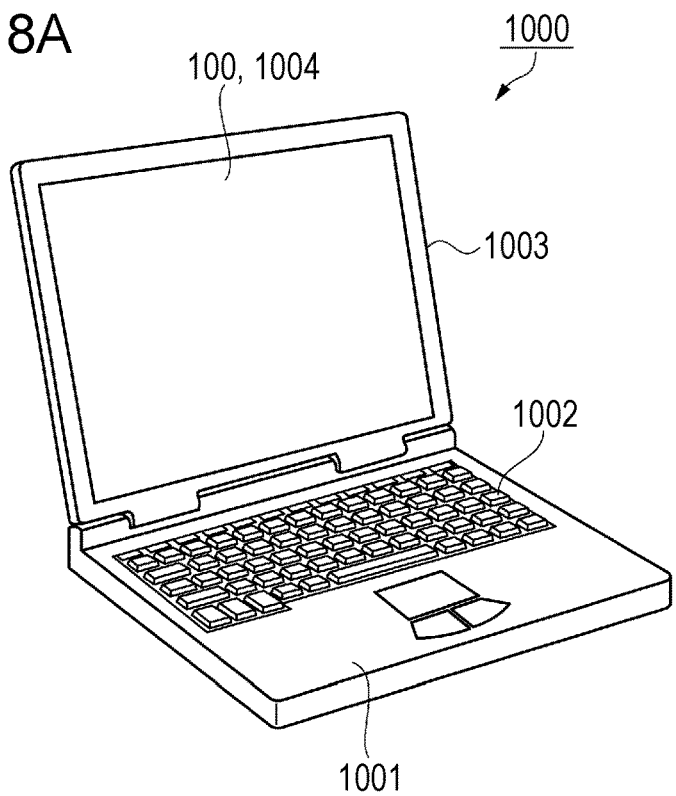
FIG. 8A is a schematic view showing a notebook personal computer that is an example of an electronic apparatus.

Next, an electronic apparatus according to an embodiment will be described with reference to FIGS. 8A and 8B. FIG. 8A is a schematic view showing a notebook personal computer that is an example of an electronic apparatus and FIG. 8B is a schematic view showing a thin-type television (TV) that is an example of an electronic apparatus.

As shown in FIG. 8A, a personal computer 1000 as an electronic apparatus is configured by a main body unit 1001 provided with a keyboard 1002, and a display unit 1003 provided with a display unit 1004, and the display unit 1003 is rotatably supported via a hinge structure unit with respect to the main body unit 1001.

In the personal computer 1000, the light emitting device 100 of the first embodiment is mounted to the display unit 1004.

Figure 8B:
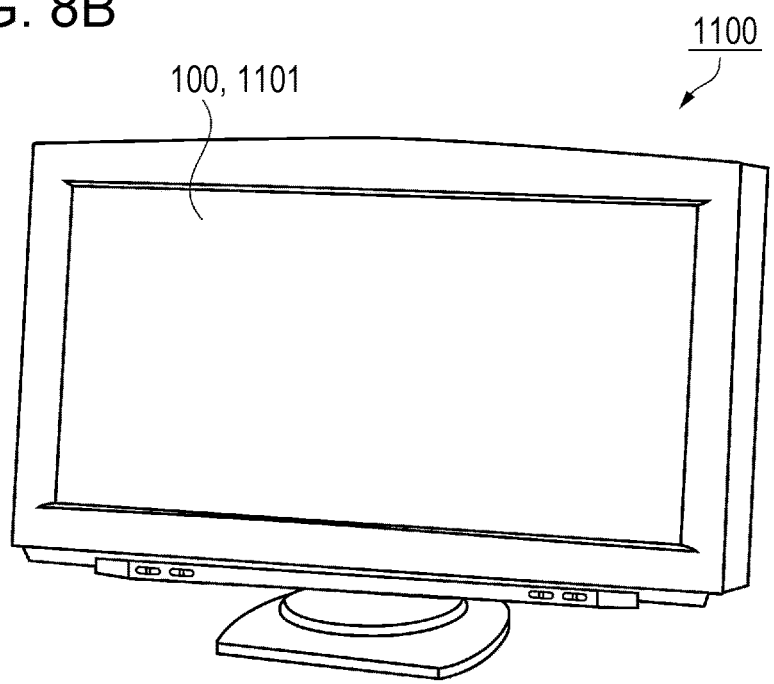
FIG. 8B is a schematic view showing a thin-type television (TV) that is an example of an electronic apparatus.

As shown in FIG. 8B, the light emitting device 100 of Embodiment 1 is mounted to the display portion 1101 of the thin-type television (TV) 1100 as an electronic apparatus.

The organic EL element 130 provided with the sub-pixels 110R, 110G, and 110B of the light emitting device 100 by at least one of the hole injection layer 131, hole transporting layer 132, and the light emitting layer 133 in the functional layer 136 is formed by a liquid phase process (ink jet method) using the ink for functional layer formation of the first embodiment. Accordingly, since there few film thickness irregularities and few light emission defects, such as dark points or bright points, a light emitting device 100 with a good yield is manufactured. That is, it is possible to provide a personal computer 1000 or thin TV 1100 with excellent cost performance.

The electronic apparatus to which the light emitting device 100 is mounted is not limited to the personal computer 1000 or thin TV 1100. For example, examples include portable information terminals, such as a smartphone or POS, an electronic apparatus with a display portion, such as a navigation system, a viewer, a digital camera or a monitor direction view video recorder.

The invention is not limited to the above-described embodiments and is able to be appropriately changed within a range not departing from the gist or spirit of the invention read from the claims and the entire specification, and an ink for functional layer formation and method for manufacturing a light emitting element, and a light emitting device, and an electronic apparatus to which the light emitting device is applied according to such changes are also further included in the technical range of the invention. Other than the above-described embodiments, various modification examples may be considered. Below, description of an example of a modification example will be given.

MODIFICATION EXAMPLE 1

The light emitting device 100 is not limited to having a top emission-type organic EL element 130 as the light emitting element, and may include a bottom emission-type organic EL element 130. The organic EL element 130 of the invention may be included in any of the sub-pixels 110R, 110G, and 110B. For example, an organic EL element 130 with a functional layer 136 formed using the ink for functional layer formation may be included in the sub-pixels 110R and 110G, and an organic EL element 130 with a functional layer 136 formed by a liquid phase process may be provided in the sub-pixel 110B.

MODIFICATION EXAMPLE 2

The light emitting device 100 in which the organic EL element 130 in which at least one layer in the functional layer 136 formed from a plurality of layers is formed using the ink jet method (liquid droplet discharge method) is applied is not limited to being a display device. For example, an illumination device or an exposure device in which a light sensitive material is exposed are also possible.

MODIFICATION EXAMPLE 3

In the method for manufacturing an organic EL element 130, the method for coating the ink for functional layer formation in the opening portion 106a surrounded by the partition wall 106 is not limited to the ink jet method (liquid droplet discharge method). For example, a dispenser (fixed amount discharge device) that discharges a predetermined amount of the ink for functional layer formation from the nozzles may also be used.

MODIFICATION EXAMPLE 4

The ink for functional layer formation to which the constitution of the solvent of the invention is applicable is not limited to being used when forming the functional layer 136 including a light emitting layer. For example, the first component that is a solute may be circuit element forming material, such as for a semiconductor layer that configures an organic transistor, or a resin material including a pigment used in a color filter.

The entire disclosure of Japanese Patent Application No.2014-059704, filed Mar. 24, 2014 is expressly incorporated by reference herein.

What is claimed is:
1. An ink for functional layer formation, comprising:
a first component that is a solute;
a second component having a first boiling point of 280° C. or greater and 350° C. or less, being a good solvent for the first component, and being at least one type selected from a group consisting of an aromatic hydrocarbon including at least two aromatic rings, aromatic glycol ether, aliphatic glycol ether, aliphatic acetate, and aliphatic ester;
a third component having a second boiling point of 200° C. or greater and 300° C. or less, being a good solvent for the first component, and being at least one type selected from a group consisting of an aromatic hydrocarbon, an aromatic ether, and an aliphatic ether,
wherein the proportion of the second component in a mixed solvent including the second component and the third component is 10 wt % or greater,
the first boiling point is greater than the second boiling point,
a difference between the first boiling point and the second boiling point is 50° C. or greater,
a viscosity of the second component is greater than a viscosity of the third component, and
the second component is 1,1-bis(3,4-dimenthyl phenyl ethane).

2. An ink for functional layer formation, comprising:
a first component that is a solute;
a second component having a first boiling point of 280° C. or greater and 350m° C. or less, being a good solvent for the first component, and being at least one type selected from a group consisting of an aromatic hydrocarbon including at least two aromatic rings, aromatic glycol ether, aliphatic glycol ether, aliphatic acetate, and aliphatic ester;
a third component having a second boiling point of 200° C. or greater and 300° C. or less, being a good solvent for the first component, and being at least one type selected from a group consisting of an aromatic hydrocarbon, an aromatic ether, and an aliphatic ether,
wherein the proportion of the second component in a mixed solvent including the second component and the third component is 10 wt % or greater,
the first boiling point is greater than the second boiling point,
a difference between the first boiling point and the second boiling point is 50° C. or greater,
a viscosity of the second component is greater than a viscosity of the third component, and
the third component is aliphatic glycol ether.

3. A method for manufacturing a light emitting element in which a functional layer that includes a light emitting layer is pinched between a pair of electrodes, the method comprising:
forming a partition wall with a liquid repellent surface, which surrounds a film formation region that includes one of the pair of electrodes on a substrate;
coating the film formation region with an ink for functional layer formation; and
drying and solidifying the coated ink for functional layer formation,
wherein the ink for functional layer formation comprises:
a first component that is a solute;
a second component having a first boiling point of 280° C. or greater and 350° C. or less, being a good solvent for the first component, and being at least one type selected from a group consisting of an aromatic hydrocarbon including at least two aromatic rings, aromatic glycol ether, aliphatic glycol ether, aliphatic acetate, and aliphatic ester; and
a third component having a second boiling point of 200° C. or greater and 300° C. or less, being a good solvent for the first component, and being at least one type selected from a group consisting of an aromatic hydrocarbon, an aromatic ether, and an aliphatic ether, wherein the proportion of the second component in a mixed solvent including the second component and the third component is 10 wt % or greater, the first boiling point is greater than the second boiling point, a difference between the first boiling point and the second boiling point is 50° C. or greater, a viscosity of the second component is greater than a viscosity of the third component, the second component is 1,1-bis(3,4-dimethyl phenyl ethane), and the first component of the ink for functional layer formation is an organic semiconductor material.

4. The method for manufacturing the light emitting element according to claim 3, wherein the first component is a high molecular weight or low molecular weight organic semiconductor material.

5. The method for manufacturing the light emitting element according to claim 3, wherein the coating includes decompressing and drying.

* * * * *